(12) United States Patent
Kim et al.

(10) Patent No.: US 9,645,484 B2
(45) Date of Patent: May 9, 2017

(54) REFLECTIVE MASKS FOR USE IN EXTREME ULTRAVIOLET LITHOGRAPHY APPARATUS AND METHODS OF MANUFACTURING THE SAME

(71) Applicants: Seong-sue Kim, Seoul (KR); Hwan-seok Seo, Suwon-si (KR); In-sung Kim, Seongnam-si (KR); Tae-geun Kim, Hwaseong-si (KR)

(72) Inventors: Seong-sue Kim, Seoul (KR); Hwan-seok Seo, Suwon-si (KR); In-sung Kim, Seongnam-si (KR); Tae-geun Kim, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 75 days.

(21) Appl. No.: 14/827,440

(22) Filed: Aug. 17, 2015

(65) Prior Publication Data

US 2016/0116835 A1 Apr. 28, 2016

Related U.S. Application Data

(60) Provisional application No. 62/066,978, filed on Oct. 22, 2014.

(30) Foreign Application Priority Data

Dec. 16, 2014 (KR) ...................... 10-2014-00181613

(51) Int. Cl.
*G03F 1/24* (2012.01)
*G03F 1/22* (2012.01)

(52) U.S. Cl.
CPC ..................................... *G03F 1/24* (2013.01)

(58) Field of Classification Search
None
See application file for complete search history.

(56) References Cited

U.S. PATENT DOCUMENTS

| 5,958,629 A | 9/1999 | Yan et al. |
| 6,593,041 B2 | 7/2003 | Yan |
| 6,607,862 B2 | 8/2003 | Yan et al. |

(Continued)

FOREIGN PATENT DOCUMENTS

| KR | 1020090095388 A | 9/2009 |
| KR | 1020100003835 A | 1/2010 |

OTHER PUBLICATIONS

Jens Timo Neumann et al., "Mask effects for high-NA EUV: impact of NA, chief-ray-angle, and reduction ratio", Extreme Ultraviolet (EUV) Lithography IV, Proc. of SPIE vol. 8679, pp. 13.

*Primary Examiner* — Stephen Rosasco
(74) *Attorney, Agent, or Firm* — Harness, Dickey & Pierce, PLLC.

(57) ABSTRACT

Reflective masks, and methods of manufacturing the same, include a reflective multi-layer on a mask substrate, a plurality of support patterns spaced apart from one another in the main trench. The plurality of support patterns are in a main trench of the reflective multi-layer. The plurality of support patterns correspond to areas of the reflective mask not transferred onto an exposure target substrate. The support patterns partition the main trench to form a plurality of auxiliary trenches. The reflective mask further includes a light absorption pattern including a plurality of auxiliary light absorption patterns in the auxiliary trenches.

18 Claims, 26 Drawing Sheets

(56) References Cited

U.S. PATENT DOCUMENTS

| | | |
|---|---|---|
| 6,641,959 B2 | 11/2003 | Yan |
| 6,986,971 B2 | 1/2006 | Han et al. |
| 7,282,307 B2 | 10/2007 | Hector et al. |
| 8,187,774 B2 | 5/2012 | Jeong |
| 8,764,995 B2 | 7/2014 | Chang et al. |
| 2004/0131947 A1 | 7/2004 | Fisch Gallagher et al. |
| 2014/0212795 A1 | 7/2014 | Tanabe et al. |

REFLECTIVE MASKS FOR USE IN EXTREME ULTRAVIOLET LITHOGRAPHY APPARATUS AND METHODS OF MANUFACTURING THE SAME

CROSS-REFERENCE TO RELATED APPLICATIONS

This application claims the benefit of U.S. Provisional Application No. 62/066,978, filed on Oct. 22, 2014, in the United States Patent and Trademark Office, and Korean Patent Application No. 10-2014-00181613, filed on Dec. 16, 2014, in the Korean Intellectual Property Office, the disclosures of which are incorporated herein in their entirety by reference.

BACKGROUND

Field

Example embodiments of the inventive concepts relate to masks for use in a lithography apparatus and/or methods of manufacturing the same, and more particularly, to reflective masks for use in an extreme ultraviolet (EUV) lithography apparatus and/or methods of manufacturing the same.

Related Art

In general, a lithography apparatus uses deep ultraviolet (DUV) light, as a light source, and a transmissive mask. As integrated circuit (IC) devices have become highly integrated and line widths thereof have become more reduced, an extreme ultraviolet (EUV) lithography apparatus has been developed which uses EUV light, a wavelength of which is shorter than that of DUV light, as a light source, and a reflective mask, so as to improve a resolution.

In the EUV lithography apparatus, a shadowing effect may occur due to obliquely incident light. That is, shadows occur on both sides of a light absorption pattern. The shadowing effect may make it difficult to accurately form a photoresist pattern on a substrate to be exposed.

SUMMARY

Example embodiments of the inventive concepts relate to masks for use in a lithography apparatus and/or methods of manufacturing the same, and more particularly, to reflective masks for use in an extreme ultraviolet (EUV) lithography apparatus and/or methods of manufacturing the same.

Some example embodiments of the inventive concepts provide a reflective mask for use in an extreme ultraviolet (EUV) lithography apparatus, which is capable of reducing a shadowing effect.

Some example embodiments of the inventive concepts provide a method of manufacturing the reflective mask for use in an EUV lithography apparatus.

According to some example embodiments of the inventive concepts, there is provided a reflective mask including a reflective multi-layer on a mask substrate, a plurality of support patterns spaced apart from one another, the plurality of support patterns being in a main trench of the reflective multi-layer, the plurality of support patterns corresponding to areas of the reflective mask not transferred onto an exposure target substrate, the support patterns partitioning the main trench to form a plurality of auxiliary trenches; and a light absorption pattern including a plurality of auxiliary light absorption patterns, the auxiliary light absorption patterns being in the auxiliary trenches.

The auxiliary light absorption patterns may be recessed within the auxiliary trenches.

The support patterns may have a same width.

The support patterns may be integral with the reflective multi-layer.

The support patterns may have a same depth, and the auxiliary light absorption patterns may have a same thickness.

The support patterns may have different depths, and the auxiliary light absorption patterns may have different thicknesses.

The reflective mask may further include a capping layer on the reflective multi-layer so as to protect the reflective multi-layer, the main trench may extend through the capping layer.

According to some example embodiments of the inventive concepts, there is provided a reflective mask including a reflective multi-layer on a mask substrate; a first light absorption pattern in a first main trench of the reflective multi-layer; and a second light absorption pattern spaced apart from the first light absorption pattern, the second light absorption pattern being in a second main trench of the reflective multi-layer, and the second main trench being wider than the first main trench.

The first light absorption pattern and the second light absorption pattern may be recessed within the first main trench and the second main trench, respectively.

First and second remaining portions of the reflective multi-layer, after etching the reflective multi-layer to a set depth, respectively define the first main trench and the second main trench.

A depth of the second main trench may be equal to a depth of the first main trench.

A depth of the second main trench may be deeper than a depth of the first main trench.

The second light absorption pattern may include a plurality of auxiliary light absorption patterns.

The reflective mask may further include support patterns between the auxiliary light absorption patterns in the second main trench, the support patterns may support the auxiliary light absorption patterns, and the support patterns may correspond to areas of the reflective mask not transferred onto an exposure target substrate.

The support patterns may be integral with the reflective multi-layer.

The auxiliary light absorption patterns may have different depths.

The reflective mask may further include a capping layer on the reflective multi-layer so as to protect the reflective multi-layer, wherein the first main trench and the second main trench may both extend through the capping layer.

According to some example embodiments of the inventive concepts, there is provided a reflective mask including a reflective multi-layer on a mask substrate, the reflective multi-layer including a first light absorption area and a second light absorption area spaced apart from the first light absorption area; a first light absorption pattern in a first main trench of the reflective multi-layer, the first main trench being in the first light absorption area a plurality of support patterns in a second main trench of the reflective multi-layer, the second main trench being in the second light absorption area, the support patterns being spaced apart from one another, the second main trench being wider than the first main trench, the support patterns corresponding to areas of the reflective mask not transferred onto an exposure target substrate, and the support patterns partitioning the second main trench to form a plurality of auxiliary trenches; and a second light absorption pattern including a plurality of auxiliary light absorption patterns, the auxiliary light absorption patterns being in the auxiliary trenches.

The support patterns may be integral with the reflective multi-layer.

A reflection area of the reflective multi-layer may be between the first light absorption pattern and the second light absorption pattern, and the first light absorption area, the reflection area, and the second light absorption area may be transferred onto the exposure target substrate as a line and space pattern.

According to some example embodiments of the inventive concepts, there is provided a method of manufacturing a reflective mask, including forming a reflective multi-layer on a mask substrate; etching a light absorption area in the reflective multi-layer to form a main trench, the etching a light absorption area including forming support patterns partitioning the main trench into a plurality of auxiliary trenches, and the support patterns corresponding to areas of the reflective mask not transferred onto an exposure target substrate; and forming a plurality of auxiliary light absorption patterns in the auxiliary trenches so as to form a light absorption pattern including the auxiliary light absorption patterns.

The forming of the light absorption pattern may include: embedding the auxiliary trenches to form a light absorption layer on the reflective multi-layer; and etching back the light absorption layer to form the auxiliary light absorption pattern in the auxiliary trenches.

The method may further include, after forming the reflective multi-layer: forming a capping layer on the reflective multi-layer; and forming the main trench including the auxiliary trenches on the capping layer, wherein the auxiliary light absorption pattern may be formed by etching back the light absorption layer by using the capping layer as an etch stop layer.

The main trench and the support patterns may be simultaneously formed, and the support patterns may be configured with the reflective multi-layer.

The auxiliary trenches may have a same depth and the auxiliary light absorption patterns may have a same thickness.

The auxiliary trenches may have different depths and the auxiliary light absorption patterns may have different thicknesses.

According to some example embodiments of the inventive concepts, there is provided a method of manufacturing a reflective mask, including forming a reflective multi-layer on a mask substrate; etching a first light absorption area of the reflective multi-layer to form a first main trench; etching a second light absorption area of the reflective multi-layer to form a second main trench, the etching a second light absorption area including forming support patterns partitioning the second main trench into a plurality of auxiliary trenches, the support patterns corresponding to areas of the reflective mask not transferred onto an exposure target substrate, the second main trench being wider than the first main trench; forming a first light absorption pattern in the first main trench; and forming a plurality of auxiliary light absorption patterns in the auxiliary trenches to form a second light absorption pattern including the auxiliary light absorption patterns.

The first main trench, the second main trench, and the support patterns may be simultaneously formed, and the support patterns may be integral with the reflective multi-layer.

The first light absorption pattern and the second light absorption pattern may be simultaneously formed.

The first light absorption pattern and the second light absorption pattern may be formed by filling the first main trench and the second main trench including the auxiliary trenches with a light absorption layer, the light absorption layer contacting the reflective multi-layer; forming the first light absorption pattern in the first main trench by etching back the light absorption layer; and forming the second light absorption pattern by forming the auxiliary light absorption patterns in the auxiliary trenches of the second main trench.

The method may further include, after the forming a reflective multi-layer, forming a capping layer on the reflective multi-layer; and forming the first main trench and the second main trench including the auxiliary trenches on the capping layer, the etching back the light absorption layer including using the capping layer as an etch stop layer.

The auxiliary trenches constituting the second main trench may be formed to have a same depth, and the auxiliary light absorption patterns constituting the second light absorption pattern may be formed to have a same thickness.

A depth of the second main trench may be equal to a depth of the first main trench.

According to some example embodiments, a reflective mask includes a reflective multi-layer on a mask substrate. The reflective multi-layer includes a first light-absorption region and a second light-absorption region spaced apart from each other, and a reflective support pattern in the second light-absorption region. The reflective mask further includes a light absorption pattern within the reflective multi-layer and interposed between the reflective support pattern.

The reflective support pattern may protrude from an upper surface of the reflective multi-layer.

The reflective multi-layer may be configured to reflect light having a wavelength of about 10 nm to about 124 nm.

The light absorption pattern may include a first light absorption pattern in the first light-absorption region, and a second light absorption pattern in the second light-absorption region.

An uppermost surface of the reflective support pattern may be coplanar with an uppermost surface of the reflective multi-layer.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
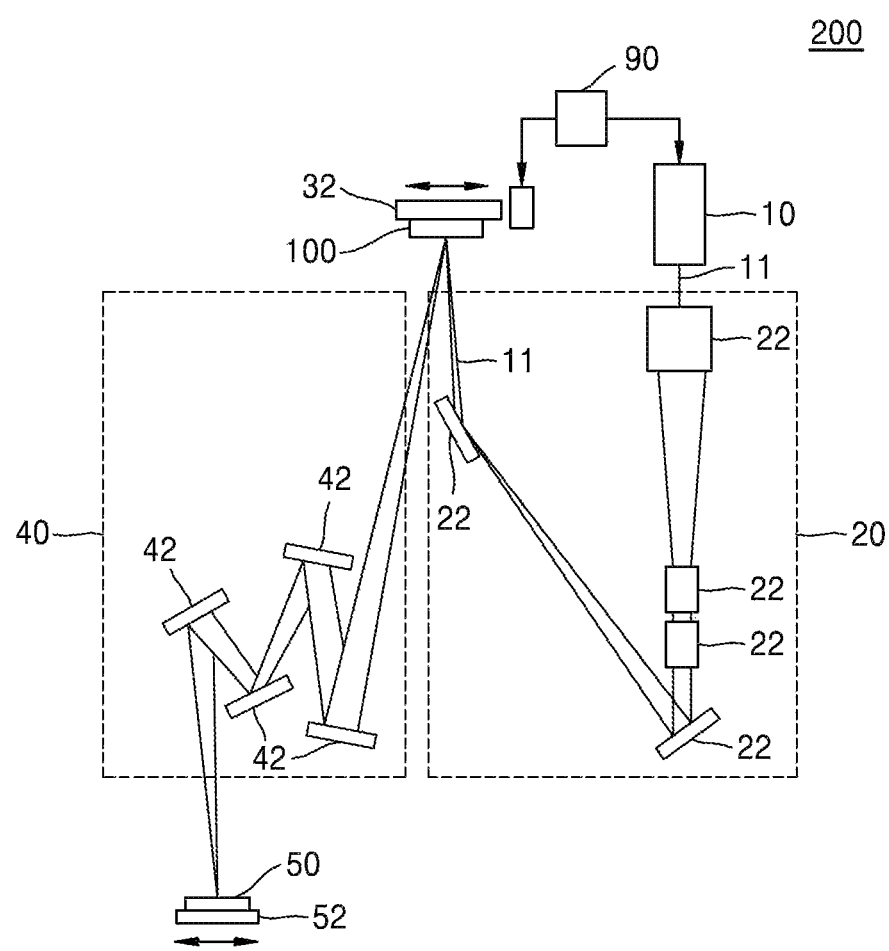
FIG. 1 is a diagram of an extreme ultraviolet (EUV) lithography apparatus using a reflective mask, according to some example embodiments of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Example embodiments of the inventive concepts relate to masks for use in a lithography apparatus and/or methods of manufacturing the same, and more particularly, to reflective masks for use in an extreme ultraviolet (EUV) lithography apparatus and/or methods of manufacturing the same.

FIG. 1 is a diagram of an extreme ultraviolet (EUV) lithography apparatus using a reflective mask, according to some example embodiments of the inventive concepts.

Referring to FIG. 1, an EUV lithography apparatus 200 may include an optical source unit 10, a condenser unit 20, a projection unit 40, and a control unit 90. The EUV lithography apparatus 200 may also be referred to as an EUV exposure apparatus. The optical source unit 10 may generate EUV light 11 having a wavelength of, for example, 13.5 nm, or about 13.5 nm. The condenser unit 20 may guide the EUV light 11 generated by the optical source unit 10, such that the EUV light 11 is reflected from a reflective mask 100 mounted on a mask stage 32.

The condenser unit 20 may include a condenser optics 22, for example, a lens or a mirror. The condenser optics 22 may collect the EUV light 11 and guide the EUV light 11 to the reflective mask 100 by reflecting the EUV light 11. The EUV light 11 may be obliquely incident on the reflective mask 100 through the condenser unit 20. The mask stage 32 may move the reflective mask 100 according to a scanning direction of the reflective mask 100. The optical source unit 10 and the mask stage 32 may be controlled by the control unit 90.

The EUV light 11, which is obliquely incident on the reflective mask 100, may be obliquely incident on the projection unit 40. The projection unit 40 may project a mask pattern of the reflective mask 100 on an exposure target substrate 50 disposed on a substrate stage 52. The exposure target substrate 50 may be a wafer on which an integrated circuit is to be formed. A photoresist, which is sensitive to light, may be coated on the exposure target substrate 50. The substrate stage 52 may move the exposure target substrate 50 so as to change an exposure region (or an exposure position) of the exposure target substrate 50.

As described below, the reflective mask 100 may reduce a shadowing effect occurring in the EUV lithography apparatus 200 by embedding a light absorption pattern in a reflective multi-layer at a predetermined (or, alternatively, set) depth. The reflective mask 100 will be described below in more detail.

The projection unit 40 may include a reflective projection optics 42, for example, a lens. The reflective projection optics 42 may reduce the mask pattern of the reflective mask 100 at a predetermined (or, alternatively, set) ratio, for example, four times, six times, or eight times, by using the reflected light 11 obliquely reflected from the reflective mask 100, and then, project the reflected light 11 on the exposure target substrate 50.

Figure 2:
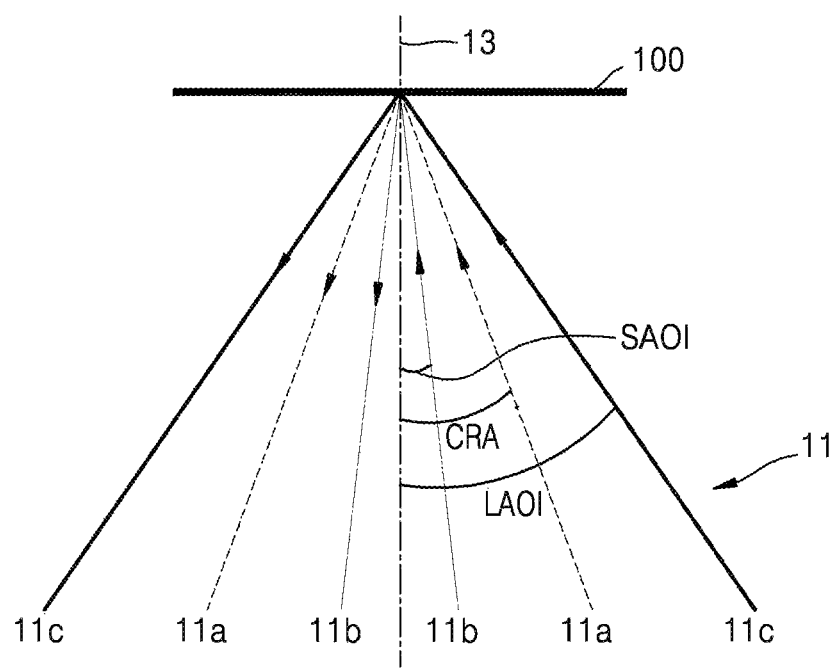
FIG. 2 is a diagram for describing a path of light incident on the reflective mask of FIG. 1.

FIG. 2 is a diagram for describing a path of light incident on the reflective mask of FIG. 1.

Referring to FIG. 2, the light (11 of FIG. 1) may be incident at a chief ray angle (CRA), a small angle of incidence (SAOI), and a large angle of incidence (LAOI) with respect to a normal line 13 of the reflective mask 100. The CRA may mean an angle of incidence of 0th-order light 11a when the light 11 is obliquely incident on the reflective mask 100. The SAOI and LAOI may mean angles of incidence of −1st-order light 11b and +1st-order light 11c, respectively, when the light 11 is obliquely incident on the reflective mask 100.

As described below, the reflective mask 100 may reduce a shadowing effect by embedding a light absorption pattern in a reflective multi-layer at a predetermined (or, alternatively, set) depth. Accordingly, when light is incident on the reflective mask 100, the resolution may be improved even when the CRA is about 6 degrees as usual. Furthermore, in the reflective mask 100, the CRA may be set to be greater than 6 degrees, for example, about 7 degrees to about 11 degrees. Accordingly, the numerical aperture (NA) of the condenser optics 22 may be increased, leading to an improvement in the resolution of the EUV lithography apparatus 200. As a result, the reflective mask 100 according to some example embodiments of the inventive concepts may improve the resolution of the EUV lithography apparatus 200.

In addition, as described above, because the reflective mask 100 is capable of reducing the shadowing effect, it is unnecessary to increase the reduction ratio of the reflective projection optics 42, for example, four times, to six times or eight times, so as to increase the NA of the lens constituting the condenser optics 22. In a case where the reduction ratio is not increased as described above, a general EUV lithography apparatus may be used and exposure productivity may be improved because an area to be exposed on the exposure target substrate 50 once is not reduced.

Figure 3:
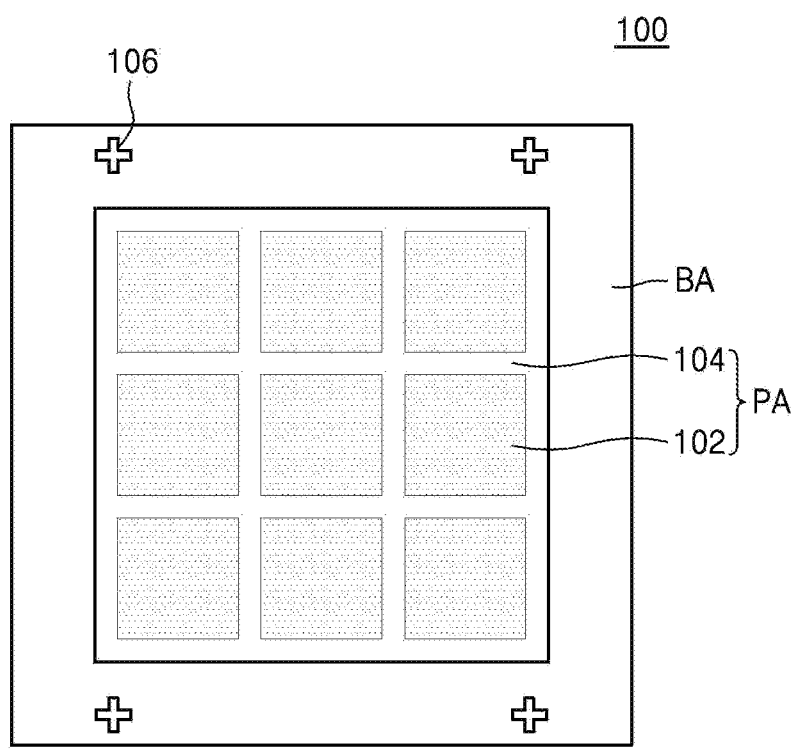
FIG. 3 is a plan view of the reflective mask of FIG. 1.

FIG. 3 is a plan view of the reflective mask of FIG. 1.

Referring to FIG. 3, the reflective mask 100 may include a pattern area PA and a black border area BA. The pattern area PA may include a main pattern area 102 and an auxiliary pattern area 104. The main pattern area 102 is an area for transferring a main pattern, which is necessary for constituting an integrated circuit in a chip area, onto the exposure target substrate (that is, the wafer) 50 of FIG. 1, and the auxiliary pattern area 104 is for transferring an auxiliary pattern in a scribe line area of the exposure target substrate 50.

The black border area BA may be an area that surrounds the pattern area PA. Hence, no specific patterns are formed in the black border area BA. In the black border area BA, a reference mark 106 may be formed. Four reference marks 106 are illustrated in FIG. 3, but some example embodiments are not limited thereto. The reference marks 106 may be used as reference points (that is, an origin of a coordinate system) for describing positions of defects occurring in a process of forming thin films constituting the reflective mask 100.

Figure 4:
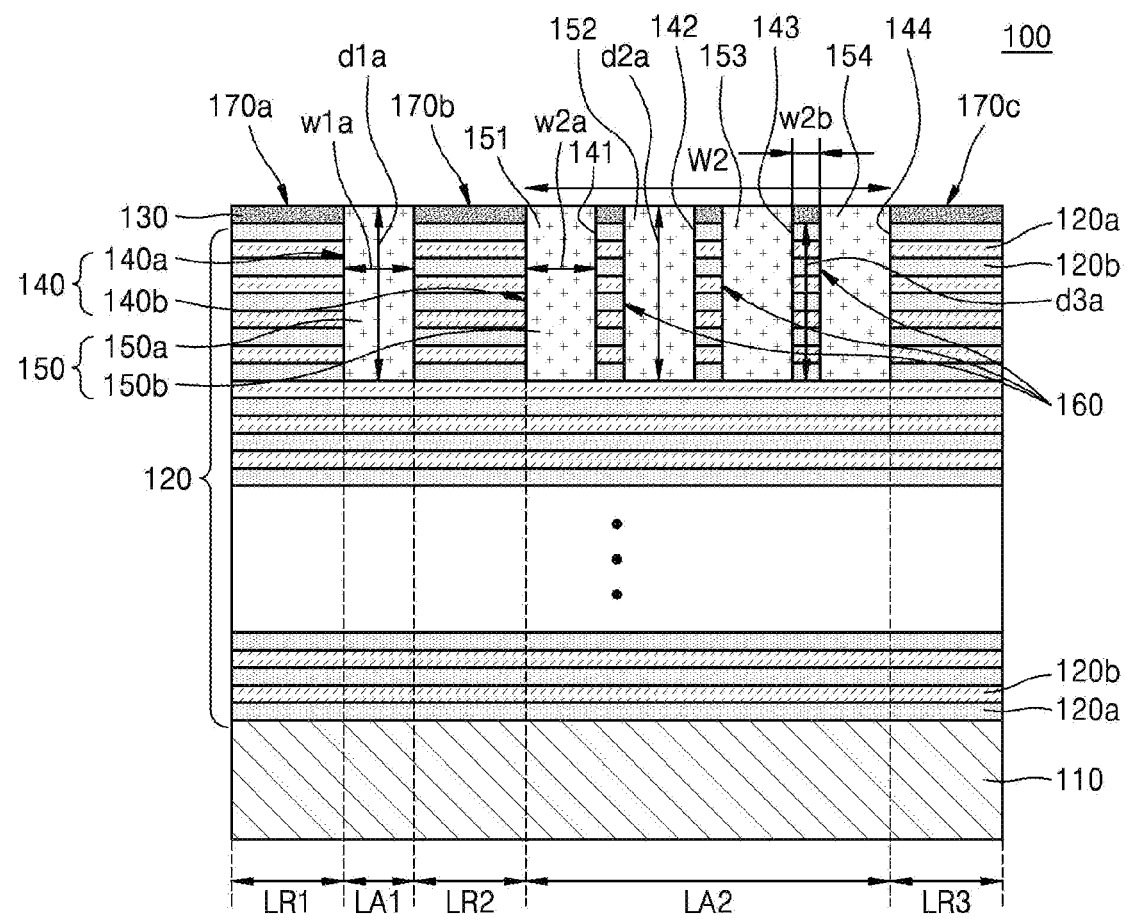
FIG. 4 is a cross-sectional view of a reflective mask for use in an EUV lithography apparatus, according to some embodiments of the inventive concepts.

FIG. 4 is a cross-sectional view of a reflective mask for use in an EUV lithography apparatus, according to some example embodiments of the inventive concepts.

Referring to FIG. 4, a reflective mask 100 may be used in the EUV lithography apparatus of FIG. 1. The reflective mask 100 may include a mask substrate 110, a reflective multi-layer 120, and a capping layer 130.

The mask substrate 110 may include a dielectric, a glass, a semiconductor, or a metal. In some example embodiments, the mask substrate 110 may include a material having a low thermal expansion coefficient. For example, the mask substrate 110 may have a thermal expansion coefficient of about $0\pm0.05\times10-7/°$ C. at 20° C. In addition, the mask substrate 110 may include a material having excellent smoothness, excellent surface flatness, and excellent tolerance to a cleaning solution. For example, the mask substrate 110 may include a low thermal expansion material (LTEM) glass, a crystallized glass, a single crystal silicon, or silicon carbide (SiC). Examples of the LTEM may include a synthesized quartz glass, a quartz glass, an aluminosilicate glass, a soda lime glass, a $SiO_2$—$TiO_2$-based glass. The crystallized glass may be formed by precipitating a β quartz solid solution.

The reflective multi-layer 120 may be formed on the mask substrate 110. The reflective multi-layer 120 may have a multi-layered mirror structure in which a high-refractive-index layer 120a and a low-refractive-index layer 120b are alternately laminated twice or more. For example, the reflective multi-layer 120 may have a structure in which the high-refractive-index layer 120a and the low-refractive-index layer 120b are repeatedly formed at about 20 cycles to about 80 cycles. In some example embodiments, the uppermost layer of the reflective multi-layer 120 may be the high-refractive-index layer 120a.

In some example embodiments, the reflective multi-layer 120 may be a double-layer cycle multi-layer. The double-layer cycle multi-layer may be one selected from the group consisting of an Mo/Si cycle multi-layer, an MO compound/Si compound cycle multi-layer, an Ru/Si cycle multi-layer, a Be/Mo cycle multi-layer, and an Si/Nb cycle multi-layer. For example, the Mo/Si cycle multi-layer may be a multi-layer obtaining by repeating a cycle of forming an Mo layer on a Si layer twice or more.

In some example embodiments, the reflective multi-layer 120 may be a multi-layer having a triple-layer cycle or more. The multi-layer having the triple-layer cycle or more may be one selected from the group consisting of an Si/Mo/Ru cycle multi-layer, an Si/Mo/Ru/Mo cycle multi-layer, and an Si/Ru/Mo/Ru cycle multi-layer. In FIG. 4, for convenience, the double-layer cycle multi-layer will be described as an example.

Materials of the reflective multi-layer 120 and film thickness of each sub-layer of the reflective multi-layer 120 may be appropriately selected according to a wavelength band of EUV light applied thereto or reflectivity of EUV light required in the reflective multi-layer 120. For example, in a case where the reflective multi-layer 120 is an Mo/Si cycle multi-layer, an Mo layer and a Si layer respectively corresponding to the low-refractive-index layer 120b and the high-refractive-index layer 120a, respectively, included in the reflective multi-layer 120 may be formed to have a thickness in the range of about 2 nm to about 5 nm.

The capping layer 130 may be formed on the reflective multi-layer 120 so as to protect the reflective multi-layer 120. The capping layer 130 may protect the reflective multi-layer 120 from being damaged and/or prevent the surface of the reflective multi-layer 120 from being oxidized. Because the capping layer 130 is optionally formed, the capping layer 130 may not be formed as necessary.

The capping layer 130 may be a silicon compound including at least one transition metal selected from the group consisting of ruthenium (Ru), nickel (Ni), and iridium (Ir). In the capping layer 130, content of the transition metal may be larger than content of silicon. The capping layer 130 may have a thickness of about 1 nm to about 6 nm. In some example embodiments, the high-refractive-index layer 120a constituting the uppermost layer of the reflective multi-layer 120 may be thicker than the capping layer 130. For example, the high-refractive-index layer 120a constituting the uppermost layer of the reflective multi-layer 120 may have a thickness of about 1.5 nm to about 2.5 nm, and the capping layer 130 may have a thickness of about 3 nm to about 6 nm.

In some example embodiments, the capping layer 130 may include an RuSi binary system compound. For example, the capping layer 130 may include $Ru_4Si_3$, RuSi, or $Ru_2Si_3$. In some example embodiments, the capping layer 130 may include an RuSiN compound.

In some example embodiments, the capping layer 130 may include an amorphous layer. For example, the capping layer 130 may be made of an RuSi compound including at least one additive element selected from the group consisting of niobium (Nb), carbon (C), boron (B), aluminium (Al), yttrium (Y), germanium (Ge), and vanadium (V). By adding the additive element to the capping layer 130 made of the RuSi compound, amorphous characteristics of the capping layer 130 may be reinforced. In addition, by adding the additive element to the capping layer 130, mechanical characteristics of the capping layer 130 may be reinforced.

In some example embodiments, the capping layer 130 may have a multi-layer structure in which a transition metal thin film and a Si film are alternately laminated once or more. For example, the capping layer 130 may have a structure in which an Ru thin film and an Si thin film are sequentially laminated. For example, the capping layer 130 may have a double-layer structure including an Ru thin film and an Si thin film formed on the Ru thin film. The Ru thin film may be thicker than the Si thin film. For example, the Ru thin film may have a thickness of about 3 nm to about 5 nm, and the Si thin film may have a thickness of about 1 nm to about 3 nm.

In some example embodiments, the capping layer 130 may have a multi-layer structure in which an Ru thin film and an Si thin film are alternately laminated twice or more. Each of the Ru thin film and the Si thin film may be formed to have a thickness of about 0.5 nm to several nanometers. In the capping layer 130, the Ru thin film is thicker than the Si thin film, so that Ru content is larger than Si content.

A main trench may be formed in (or, alternatively, extend through) the reflective multi-layer 120 and the capping layer 130. The main trench 140 may be a groove that is formed by etching the capping layer 130 and the reflective multi-layer 120 to a predetermined (or, alternatively, set) depth. The main trench 140 may be divided into a first main trench 140a and a second main trench 140b. The first main trench 140a is formed in a first light absorption area LA1 of the reflective multi-layer 120, and the second main trench 140b is separate from the first main trench 140a and is formed in a second light absorption area LA2 of the reflective multi-layer 120.

A width W2 of the second main trench 140b may be greater than a width w1a of the first main trench 140a. In some example embodiments, a depth d2a of the second main trench 140b may be equal to a depth d1a of the first main trench 140a. A plurality of auxiliary trenches 141 to 144 partitioned by a plurality of support patterns 160 may be provided in the second main trench 140b.

The auxiliary trenches 141 to 144 may have the same width w2a. In some example embodiments, the auxiliary trenches 141 to 144 may have different depths d2a. The width w2a of the auxiliary trenches 141 to 144 may be equal to the width w1a of the first main trench 140a. The number of the auxiliary trenches 141 to 144 may be determined according to the width W2 of the second main trench 140b. Widths w2b of the support patterns 160 may be configured so as not to be transferred onto the exposure target substrate (not shown). The support patterns 160 may be configured with the reflective multi-layer 120.

A light absorption pattern 150 may be formed in the first main trench 140a and the second main trench 140b. The depths d1a and d2a of the main trench 140 may be an embedded (or, alternatively, recessed) depth of the light absorption pattern 150. The embedded depth corresponds to the depth of the first main trench 140a and the auxiliary trenches 141 to 144. Depths d3a of the support patterns 160 may be equal to each other. The depth d3a of the support patterns and a depth of the capping layer 130 may collectively be equal to the depths dl a and d2a of the main trench 140. The embedded depth may be about 80 nm to about 100 nm. In some example embodiments, the embedded depth may be about 80 nm to about 120 nm. The light absorption pattern 150 may include a material that absorbs EUV light and has very low reflectivity with respect to the EUV light. The light absorption pattern 150 may include a material having excellent chemical resistance. In some example embodiments, the light absorption pattern may include a material of which a maximum light reflectivity around a wavelength of 13.5 nm is about 5% or less when EUV light is irradiated on the surface thereof.

The light absorption pattern 150 may include a material containing tantalum (Ta) as a main component. In some example embodiments, the light absorption pattern 150 may include tantalum (Ta) and at least one element selected from the group consisting of hafnium (Hf), silicon (Si), zirconium (Zr), germanium (Ge), boron (B), nitrogen (N), and hydrogen (H). For example, the light absorption pattern 150 may include one selected from the group consisting of TaN, TaHf, TaHfN, TaBSi, TaBSiN, TaB, TaBN, TaSi, TaSiN, TaGe, TaGeN, TaZr, TaZrN, and combinations thereof. In some example embodiments, the light absorption pattern 150 may include a material in which content of tantalum (Ta) is at least 40 atomic %. In some example embodiments, the light absorption pattern 150 may further include about 0 atomic % to about 25 atomic % of oxygen (O).

The light absorption pattern 150 may be divided into a first light absorption pattern 150a formed in the first main trench 140a, and a second light absorption pattern 150b formed in the second main trench 140b. The second light absorption pattern 150b may include auxiliary light absorption patterns 151 to 154 formed in the auxiliary trenches 141 to 144. The auxiliary light absorption patterns 151 to 154 and the auxiliary trenches 141 to 144 may have the same width w2a. The auxiliary light absorption patterns 151 to 154 may be supported by the support patterns 160. The first light absorption pattern 150a and the second light absorption pattern 150b may be embedded (or, alternatively, recessed) in the first main trench 140a and the auxiliary trenches 141 and 144.

Due to the formation of the light absorption pattern 150, areas except for the light absorption areas LA1 and LA2 may become reflection areas LR1, LR2, and LR3. The reflection areas LR1, LR2, and LR3 may correspond to reflection patterns 170a, 170b, and 170c, respectively. The reflection area LR2 may be disposed between the first light absorption area LA1 and the second light absorption area LA2. In an exposure process, the first light absorption area LA1, the reflection area LR2, and the second light absorption area LA2 may be transferred as line and space patterns of the exposure target substrate.

As described above, in the reflective mask 100, the light absorption pattern 150 is embedded in the main trench 140 formed in the reflective multi-layer 120. Accordingly, when the exposure process is performed using the EUV lithography apparatus 200 of FIG. 1, it is possible to reduce the shadowing effect that causes shadows to occur on both sides of the light absorption pattern 150.

Accordingly, when light is incident on the reflective mask 100, the resolution of in the EUV lithography apparatus 200 may be improved even when the CRA is not increased at about 6 degrees. Furthermore, when light is incident on the reflective mask 100, the CRA may be set to be greater than 6 degrees, for example, about 7 degrees to about 11 degrees. Accordingly, the NA of the lens constituting the condenser optics 22 may be increased, leading to an improvement in the resolution of the EUV lithography apparatus 200.

Because the reflective mask 100 is capable of reducing the shadowing effect, it is unnecessary to increase the reduction ratio of the reflective projection optics 42, for example, four times, so as to increase the NA of the lens constituting the condenser optics 22. Therefore, the reflective mask 100 according to some example embodiments of the inventive concepts may be used without changing the configuration of the lithography apparatus.

Furthermore, the reflective mask 100 may accurately transfer the photoresist pattern onto the exposure target substrate. That is, it is possible to reduce a difference of a critical dimension between the reflective mask 100 and the photoresist pattern of the exposure target substrate and it is possible to suppress a position movement of the photoresist pattern on the exposure target substrate.

Figure 5:
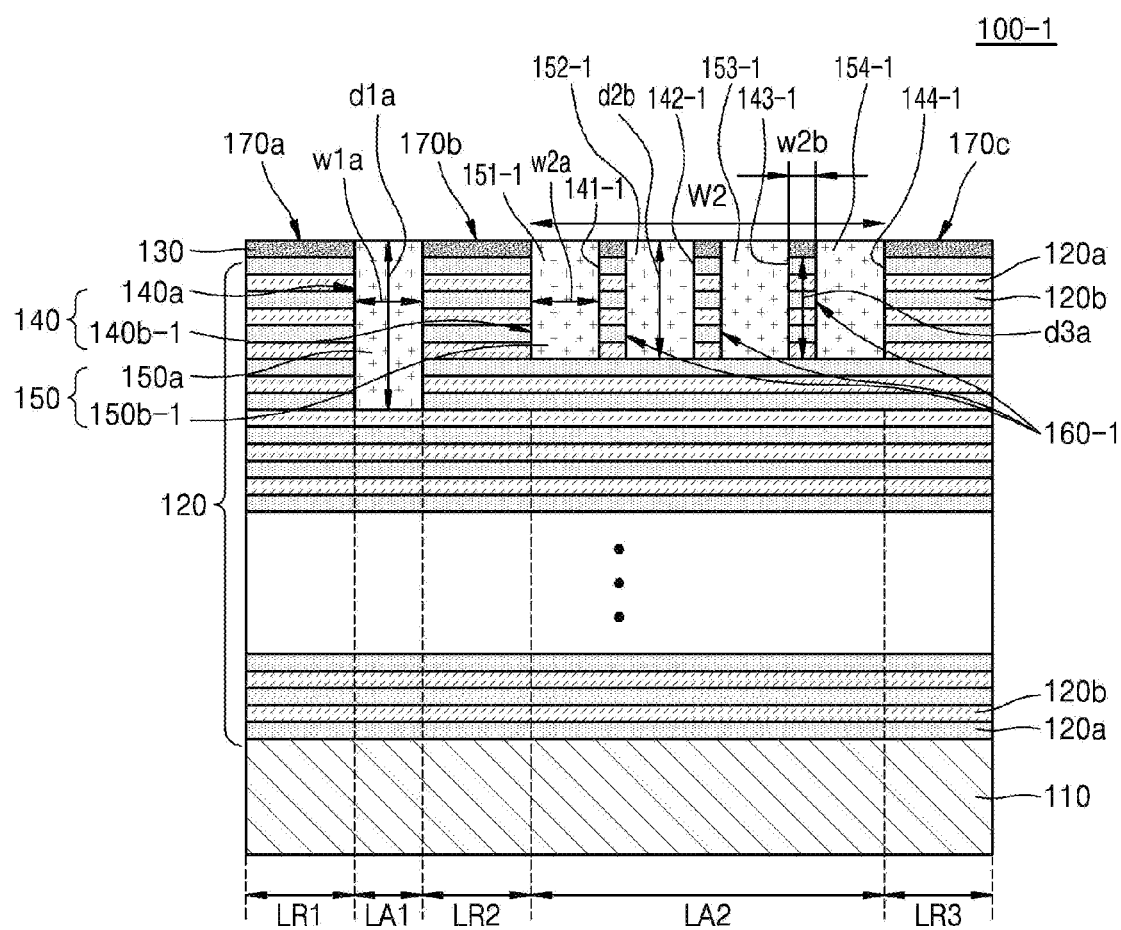
FIG. 5 is a cross-sectional view of a reflective mask for use in an EUV lithography apparatus, according to some example embodiments of the inventive concepts.

FIG. 5 is a cross-sectional view of a reflective mask for use in an EUV lithography apparatus, according to some example embodiments of the inventive concepts.

Referring to FIG. 5, a reflective mask 100-1 may be substantially identical to the reflective mask 100 of FIG. 4, except that a depth d2b of a second main trench 140b-1 is shallower than a depth d1a of a first main trench 140a.

The reflective mask 100-1 may be configured such that the depth d2b of the second main trench 140b-1 is shallower than the depth d1a of the first main trench 140a. The reflective mask 100-1 may be configured such that the depth d2b of the second main trench 140b-1 is shallower than the depth d2a of the second main trench 140b of the reflective mask 100 of FIG. 4.

Depths d3b of the support patterns 160-1 may be equal to each other. The depth d3b of the support patterns 160-1 and a depth of the capping layer 130 may collectively be shallower (or alternatively, less) than the depth d1a of the first main trench 140a.

A light absorption pattern 150 may be embedded in (or, alternatively, recessed within) the first main trench 140a and the second main trench 140b-1. The light absorption pattern 150 may be divided into a first light absorption pattern 150a formed in the first main trench 140a, and a second light absorption pattern 150b-1 formed in the second main trench 140b-1. The second light absorption pattern 150b-1 may include auxiliary light absorption patterns 151-1, 152-1, 153-1, and 154-1 that are embedded in (or, alternatively, recessed within) auxiliary trenches 141-1, 142-1, 143-1, and 144-1 partitioned by support patterns 160-1 in the second main trench 140b-1.

Figure 6:
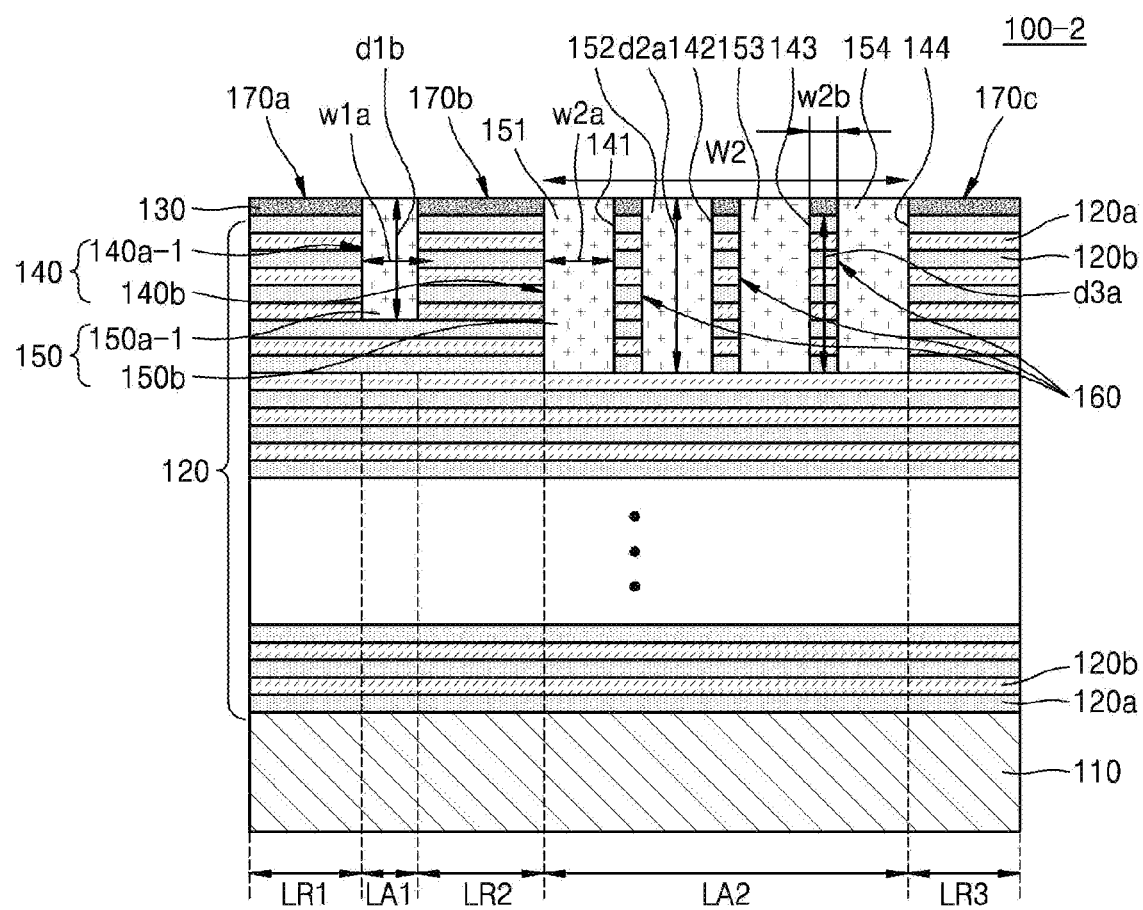
FIG. 6 is a cross-sectional view of a reflective mask for use in an EUV lithography apparatus, according to some example embodiments of the inventive concepts.

FIG. 6 is a cross-sectional view of a reflective mask for use in an EUV lithography apparatus, according to some example embodiments of the inventive concepts.

Referring to FIG. 6, a reflective mask 100-2 may be substantially identical to the reflective mask 100 of FIG. 4, except that a depth d1b of a first main trench 140a-1 is shallower than a depth d2a of a second main trench 140b.

The reflective mask 100-2 may be configured such that the depth d1b of the first main trench 140a-1 is shallower than the depth d2a of the second main trench 140b. The reflective mask 100-2 may be configured such that the depth d1b of the first main trench 140a-1 is shallower than the depth d1a of the first main trench 140a of the reflective mask 100 of FIG. 4.

Depths d3a of the support patterns 160 may be equal to each other. The depth d3a of the support patterns 160 and a depth of the capping layer 130 may collectively be greater (or, alternatively, deeper) than the depth d1b of the first main trench 140a-1.

A light absorption pattern 150 may be embedded in the first main trench 140a-1 and the second main trench 140b. The light absorption pattern 150 may be divided into a first light absorption pattern 150a-1 formed in the first main trench 140a-1, and a second light absorption pattern 150b formed in the second main trench 140b. The second light absorption pattern 150b may include auxiliary light absorption patterns 151 to 154 formed in the auxiliary trenches 141 to 144.

Figure 7:
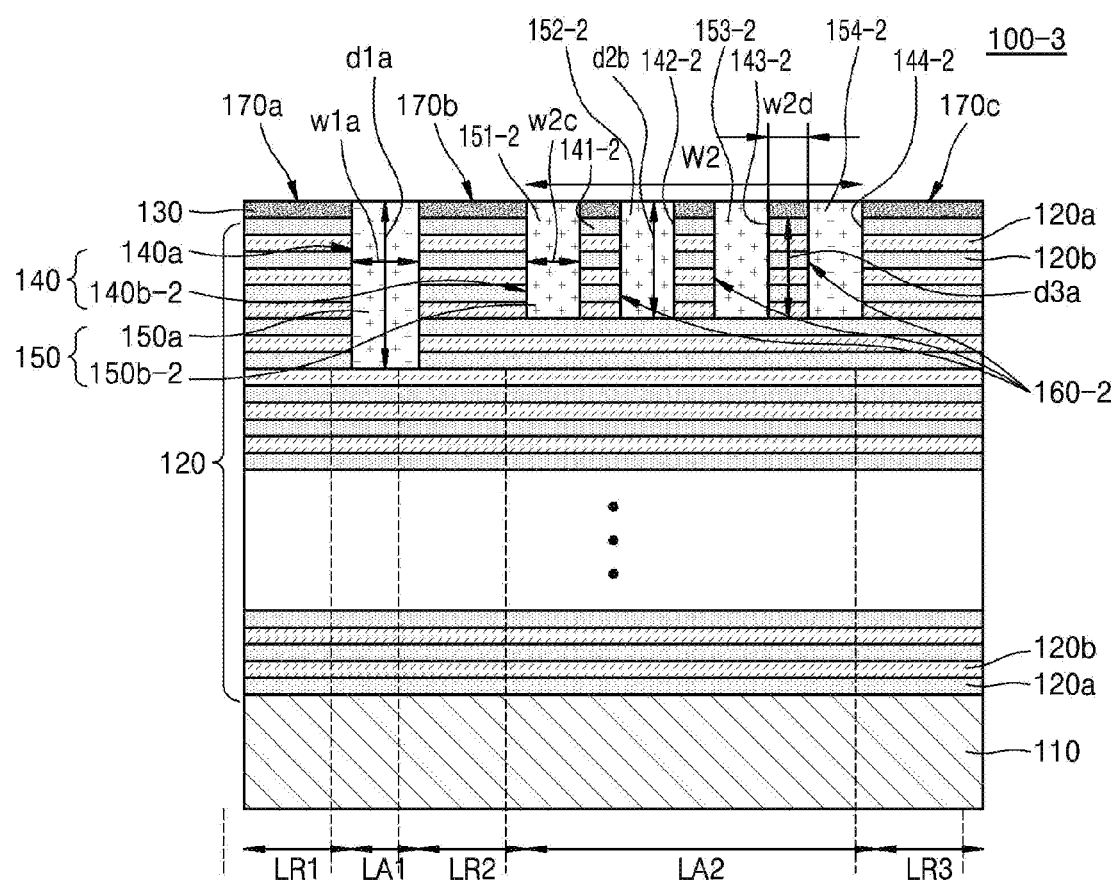
FIG. 7 is a cross-sectional view of a reflective mask for use in an EUV lithography apparatus, according to some example embodiments of the inventive concepts.

FIG. 7 is a cross-sectional view of a reflective mask for use in an EUV lithography apparatus, according to some example embodiments of the inventive concepts.

Referring to FIG. 7, a reflective mask 100-3 may be substantially identical to the reflective mask 100-1 of FIG. 5, except that widths w2c of auxiliary trenches 141-2, 142-2, 143-2, and 144-2 constituting a second main trench 140b-2 and widths w2d of support patterns 160-2 included in the second main trench 140b-2 are changed.

In the reflective mask 100-3, the widths w2c of the auxiliary trenches 141-2, 142-2, 143-2, and 144-2 constituting the second main trench 140b-2 may be less than the widths w2a of the auxiliary trenches 141 to 144 of the reflective mask 100-1 of FIG. 5. In the reflective mask 100-3, the widths w2d of the support patterns 160-2 included in the second main trench 140b-2 may be greater than the widths w2b of the support patterns 160 of the reflective mask 100-1 of FIG. 5. The widths w2d of the support patterns 160-2 may be variously adjusted when configured so as not to be transferred onto the exposure target substrate.

Depths d3b of the support patterns 160-2 may be equal to each other. The depth d3b of the support patterns 160-2 and a depth of the capping layer 130 may collectively be shallower (or, alternatively, less) than the depth d1a of the first main trench 140a.

A light absorption pattern 150 may be embedded in (or, alternatively, recessed within) the first main trench 140a and the second main trench 140b-2. The light absorption pattern 150 may be divided into a first light absorption pattern 150a formed in the first main trench 140a, and a second light absorption pattern 150b-2 formed in the second main trench 140b-2. The second light absorption pattern 150b-2 may include auxiliary light absorption patterns 151-2, 152-2, 153-2, and 154-2 that are embedded in (or, alternatively, recessed within) auxiliary trenches 141-2, 142-2, 143-2, and 144-2 partitioned by the support patterns 160-2 in the second main trench 140b-2.

Figure 8:
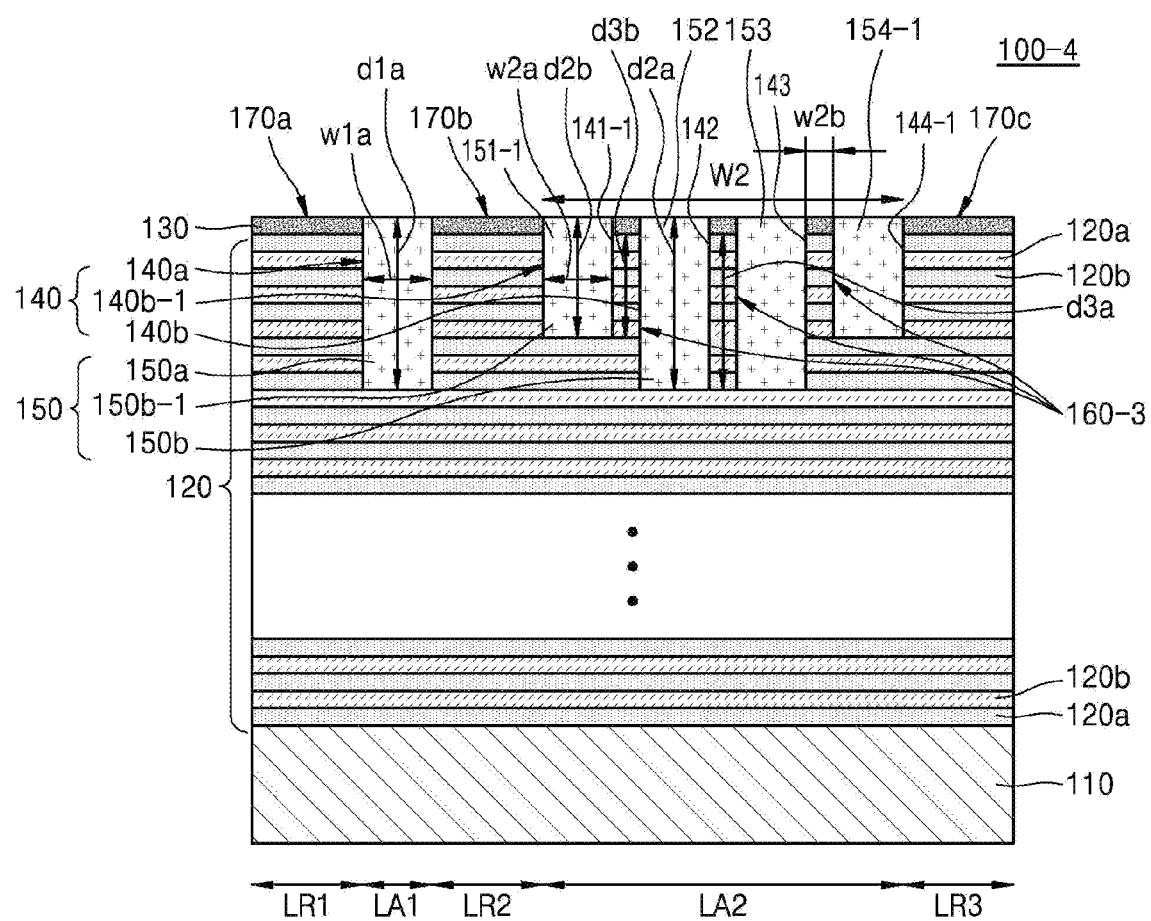
FIG. 8 is a cross-sectional view of a reflective mask for use in an EUV lithography apparatus, according to some example embodiments of the inventive concepts.

FIG. 8 is a cross-sectional view of a reflective mask for use in an EUV lithography apparatus, according to some example embodiments of the inventive concepts.

Referring to FIG. 8, a reflective mask 100-4 may include a combination of features from the reflective masks 100 and 100-1 of FIGS. 4 and 5. The reflective mask 100-4 of FIG. 8 may be substantially identical to the reflective masks 100 and 100-1 of FIGS. 4 and 5, except that the reflective mask 100-4 includes second main trenches 140b and 140b-1 having depths d2a and d2b, respectively.

The reflective mask 100-4 may be configured such that the second main trenches 140b and 140b-1 have depths d2a and d2b, respectively. That is, the second main trenches 140b and 140b-1 may be configured to have shallow or deep depths d2a and d2b.

Depths d3a and d3b of the support patterns 160-3 may be different from each other. The depth d3b of the support patterns 160-3 and a depth of the capping layer 130 may collectively be shallower (or, alternatively, less) than the depth d1a of the first main trench 140a. The depth d3a of the support patterns 160-3 and the depth of the capping layer 130 may collectively be equal to the depth d1a of the first main trench 140a.

A light absorption pattern 150 may be embedded in (or, alternatively, recessed within) the first main trench 140a and the second main trenches 140b and 140b-1. The light absorption pattern 150 may be divided into a first light absorption pattern 150a formed in the first main trench 140a, and second light absorption patterns 150b and 150b-1 formed in the second main trenches 140b and 140b-1. The second light absorption patterns 150b and 150b-1 may include auxiliary light absorption patterns 151-1, 152, 153, and 154-1 that are embedded in (or, alternatively, recessed within) auxiliary trenches 141-1, 142, 143, and 144-1 partitioned by support patterns 160-3 in the second main trenches 140b and 140b-1.

Hereinafter, for convenience, a method of manufacturing the reflective mask of FIG. 4 will be described. The method of manufacturing the reflective mask may also be applied to methods of manufacturing the above-described reflective masks.

FIGS. 9A to 9D are cross-sectional views for describing a method of manufacturing a reflective mask, according to some example embodiments.

Figure 9A:
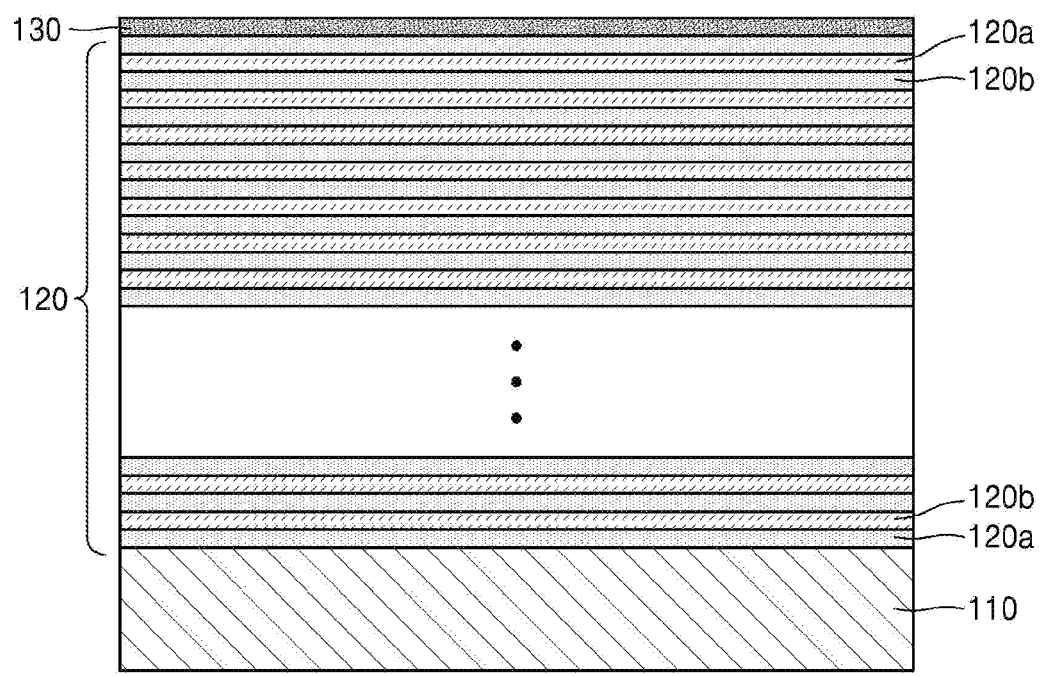
FIGS. 9A to 9D are cross-sectional views for describing a method of manufacturing a reflective mask, according to some example embodiments.

Referring to FIG. 9A, a reflective multi-layer 120 may be formed on a mask substrate 110. As described above, the mask substrate 110 may include a dielectric, a glass, a semiconductor, or a metal. As described above, the reflective multi-layer 120 may have a multi-layered mirror structure in which a high-refractive-index layer 120a and a low-refractive-index layer 120b are alternately laminated twice or more.

As described above, the reflective multi-layer 120 may be one selected from the group consisting of an Mo/Si cycle multi-layer, an MO compound/Si compound cycle multi-layer, an Ru/Si cycle multi-layer, a Be/Mo cycle multi-layer, and an Si/Nb cycle multi-layer. For example, when the reflective multi-layer 120 is the Mo/Si cycle multi-layer, the low-refractive-index layer 120b may be an Mo layer and the high-refractive-index layer 120a may be an Si layer.

The reflective multi-layer 120 may be formed using a DC sputtering process, an RF sputtering process, or an ion beam sputtering process. For example, when the Mo/Si reflective multi-layer is formed using the ion beam sputtering process, an Si film and an Mo layer may be respectively formed to have a thickness of about 2 nm to about 5 nm by repeating a cycle about 20 times to about 80 times, wherein the cycle includes depositing the Si film by using an Si target as a target and Ar gas as a sputter gas, and depositing the Mo film by using an Mo target as a target and Ar gas as a sputter gas.

A capping layer 130 may be formed on the reflective multi-layer 120 so as to protect the reflective multi-layer 120. After forming the reflective multi-layer 120, the capping layer 130 may be formed in-situ in the same chamber where the reflective multi-layer 120 is formed, without being exposed to the atmosphere. Therefore, it is possible to prevent an unwanted oxide film from being formed between the reflective multi-layer 120 and the capping layer 130 due to the exposure to the atmosphere prior to the formation of the capping layer 130 and after the formation of the reflective multi-layer 120, and it is possible to prevent an unwanted intermixing film from being formed by mutual diffusion of other materials met at an interface between the reflective multi-layer 120 and the capping layer 130.

The capping layer 130 may be a silicon compound including at least one transition metal selected from the group consisting of ruthenium (Ru), nickel (Ni), and iridium (Ir). As described above, the capping layer 130 may include an RuSi binary system compound. The capping layer 130 including the RuSi binary system compound may be formed by an ion beam sputtering process using a target including an Ru/Si compound.

In some example embodiments, the capping layer 130 may include an RuSiN compound. For example, in the sputtering process of forming the capping layer 130 by using the RuSi target, N element contained in an $Ar/N_2$ mixed gas used as an ambient gas may be mixed into the capping layer 130, thus obtaining the capping layer 130 including the RuSiN compound. In some example embodiments, the capping layer 130 may be an RuSi compound including at least one additive element selected from the group consisting of niobium (Nb), carbon (C), boron (B), aluminium (Al), yttrium (Y), germanium (Ge), and vanadium (V). The capping layer 130 including the additive element may be formed by an ion beam sputtering process using a target including Ru, Si, and at least one additive element.

In some example embodiments, the capping layer 130 may have a multi-layer structure in which an Ru thin film and an Si thin film are alternately laminated twice or more. The capping layer 130, which has the multi-layer structure in which the Ru thin film and the Si thin film are alternately laminated twice or more, may be formed by repeating an ion beam sputtering process of forming an Ru thin film by using an Ru target and an ion beam sputtering process of forming an Si thin film by using an Si target.

Figure 9B:
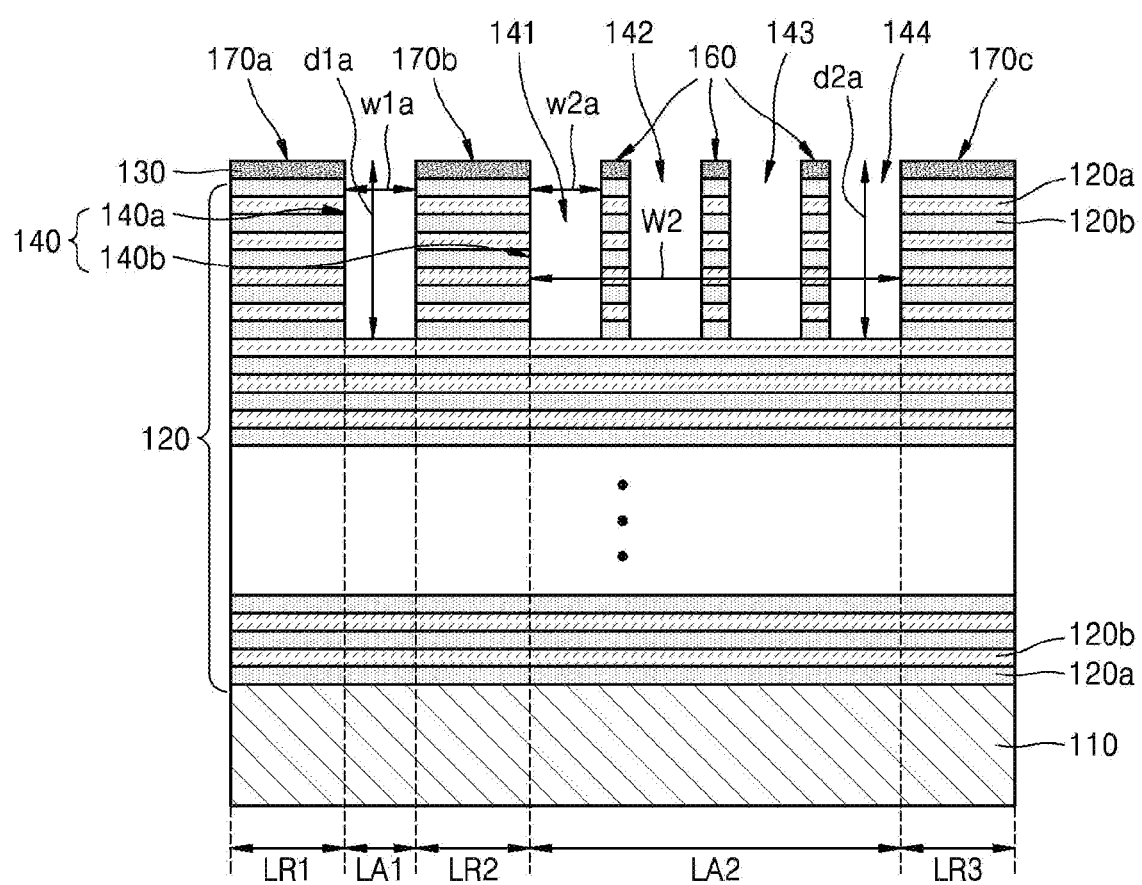

Referring to FIG. 9B, the reflective multi-layer 120 and the capping layer 130 may be etched to a predetermined (or, alternatively, set) depth to form a main trench 140 and support patterns 160. The main trench 140 may be formed by forming a mask pattern (not illustrated) on the capping layer 130 and dry-etching the reflective multi-layer 120 and the capping layer 130.

The main trench 140 may include a first main trench 140a and a second main trench 140b. The second main trench 140b may be separate from the first main trench 140a and include a plurality of auxiliary trenches 141 to 144 partitioned by support patterns 160. A width W2 of the second main trench 140b may be greater than a width w1a of the first main trench 140a. A depth d2a of the second main trench 140b may be equal to a depth d1a of the first main trench 140a.

The first main trench 140a may be formed by etching a first light absorption area LA1 defined in the reflective multi-layer 120. The second main trench 140b may be formed by etching a second light absorption area LA2 defined in the reflective multi-layer 120. When the second main trench 140b is formed, auxiliary trenches 141 to 144 partitioned by the support patterns 160 may be formed in the second main trench 140b. The auxiliary trenches 141 to 144 may be formed to have different widths w2a and depths d2a. The width w2a of the auxiliary trenches 141 to 144 may each be equal to the width w1a of the first main trench 140a.

The support patterns 160 may be formed between the auxiliary trenches 141 to 144. The support patterns 160 may be made of the reflective multi-layer 120. Because the support patterns 160 are not transferred onto an exposure target substrate, an area including the support patterns 160 may also be defined as the second light absorption area LA2. Areas except for the first and second light absorption areas LA1 and LA2 may become reflection areas LR1, LR2, and LR3. The reflection areas LR1, LR2, and LR3 may correspond to reflection patterns 170a, 170b, and 170c, respectively.

Figure 9C:
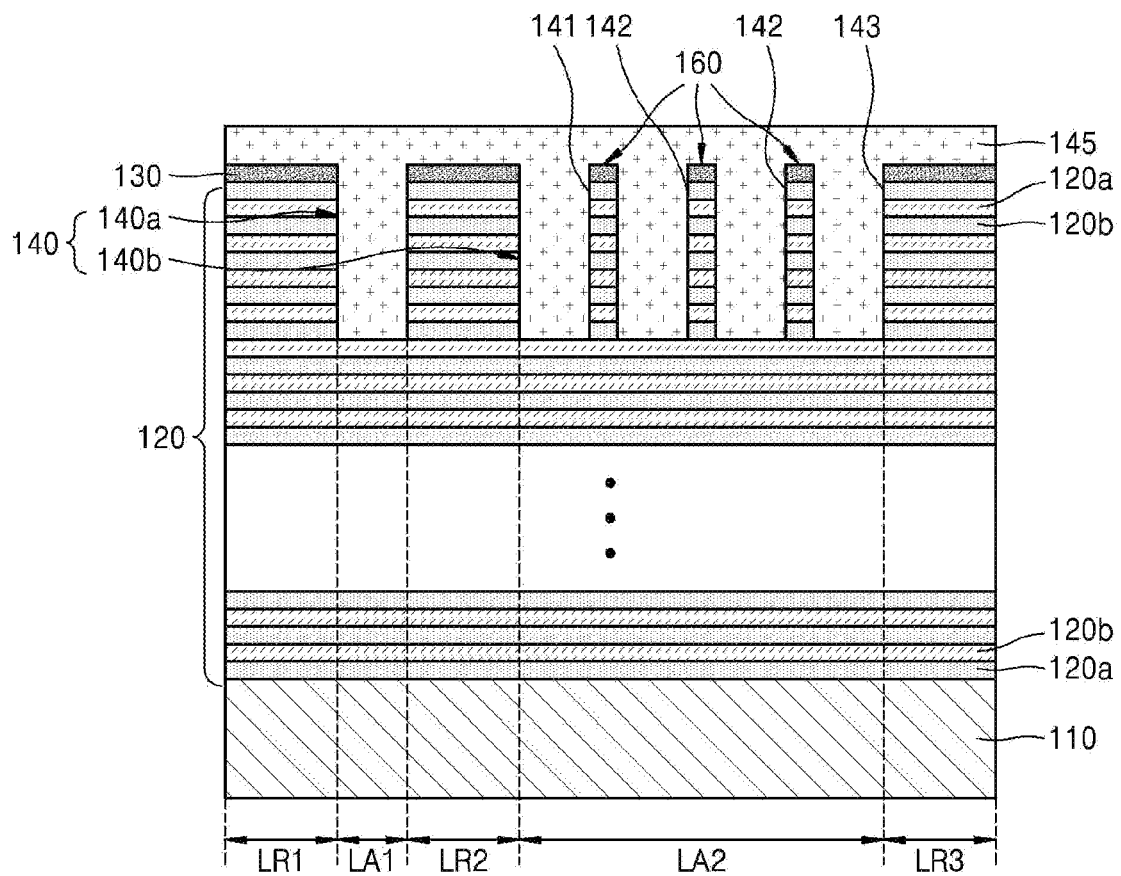

Referring to FIG. 9C, a light absorption layer 145 may be formed to embed the main trench 140. While embedding the first main trench 140a and the second main trench 140b including the auxiliary trenches 141 to 144, the light absorption layer 145 may be formed on the reflective multi-layer 120 and the capping layer 130. The light absorption layer 145 may be formed in the second main trench 140b while embedding the auxiliary trenches 141 to 144 partitioned by the support patterns 160.

As described above, the light absorption layer 145 may include tantalum (Ta), which is a main component, and at least one element selected from the group consisting of hafnium (Hf), silicon (Si), zirconium (Zr), germanium (Ge), boron (B), nitrogen (N), and hydrogen (H). The light absorption layer 145 may be formed by a physical vapor deposition (PVD) process or a sputtering process. Even when the width W2 of the second main trench 140b is greater than the width w1a of the first main trench 140a, the light absorption layer 145 may be easily embedded in (or, alternatively, recessed within) the second main trench 140b because the support patterns 160 are formed in the second main trench 140b.

Figure 9D:
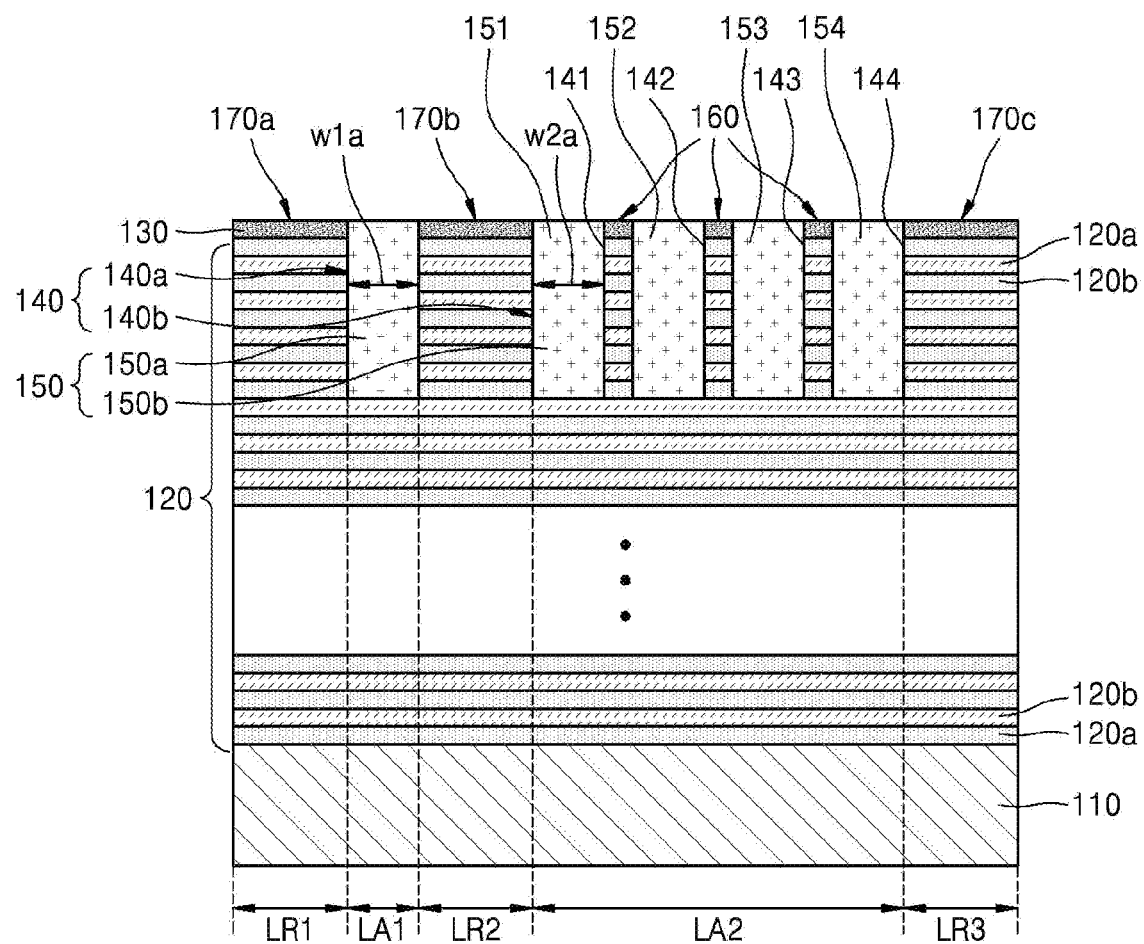

Referring to FIG. 9D, the light absorption layer 145 may be etched back to form a light absorption pattern 150. The light absorption pattern 150 may be formed by etching the light absorption layer 145 by using the capping layer 130 as an etch stop layer. A first light absorption pattern 150a and a second light absorption pattern 150b may be simultaneously formed.

As described above, the light absorption pattern 150 may be divided into the first light absorption pattern 150a formed in the first main trench 140a, and the second light absorption pattern 150b formed in the second main trench 140b. The second light absorption pattern 150b may include auxiliary light absorption patterns 151 to 154 formed in the auxiliary trenches 141 to 144.

The width w1a of the first light absorption pattern 150a may be equal to the width w1a of the first main trench 140a. The width w2a of the auxiliary light absorption patterns 151 to 154 may be equal to the width w2a of the auxiliary trenches 141 to 144. The auxiliary light absorption patterns 151 to 154 may be supported by the support patterns 160.

The first light absorption pattern 150a and the second light absorption pattern 150b may be embedded (or, alternatively, recessed) within the first main trench 140a and the auxiliary trenches 141 and 144.

Figure 10A:
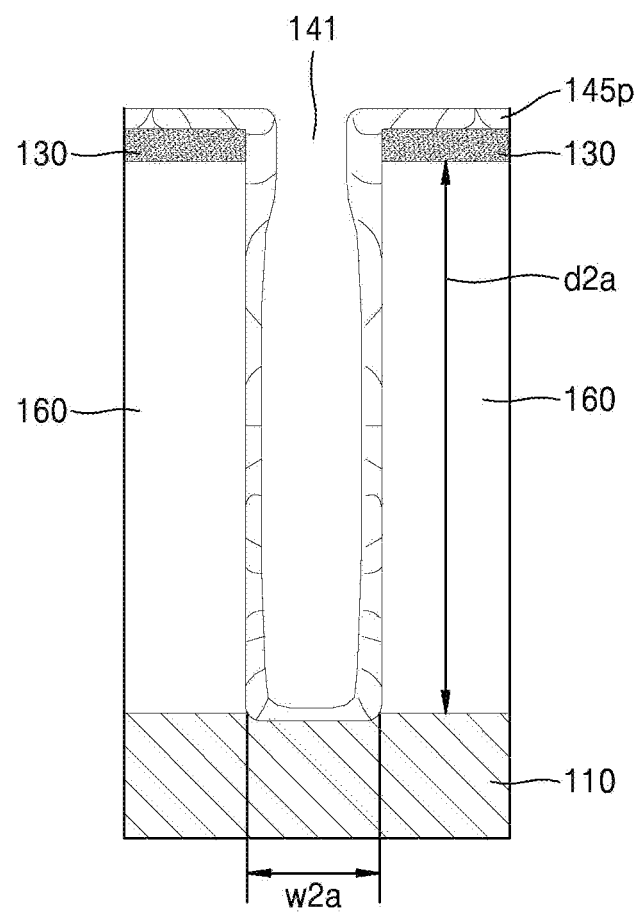
FIGS. 10A and 10B are exploded cross-sectional views for describing a process of forming a light absorption layer in an auxiliary trench of FIG. 9C.
Figure 10B:
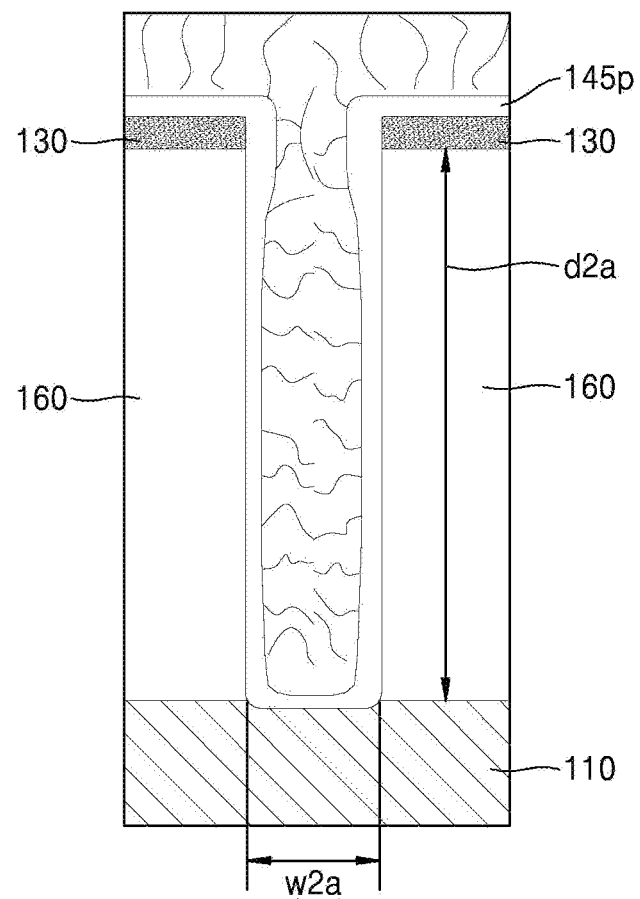

FIGS. 10A and 10B are exploded cross-sectional views for describing the process of forming the light absorption layer in the auxiliary trench of FIG. 9C.

Referring to FIG. 10A, an auxiliary trench 141 having a depth d2a and a width w2a is formed between the support patterns 160 on the mask substrate 110. At the early stage of forming the light absorption layer 145, an auxiliary light absorption layer 145p may be formed on both sidewalls of the auxiliary trench 141 and the capping layer 130 disposed on the support patterns 160.

Referring to FIG. 10B, a light absorption material may be deposited on the auxiliary light absorption layer 145p to form the light absorption layer 145 filling the auxiliary trench 141. The auxiliary trench 141 may be well embedded (or, alternatively, recessed) by depositing the light absorption material on the auxiliary light absorption layer 145p on both sidewalls of the auxiliary trench 141. As a result, the light absorption layer 145 may be easily formed by forming the support patterns 160 in the second main trench 140b.

Figure 11A:
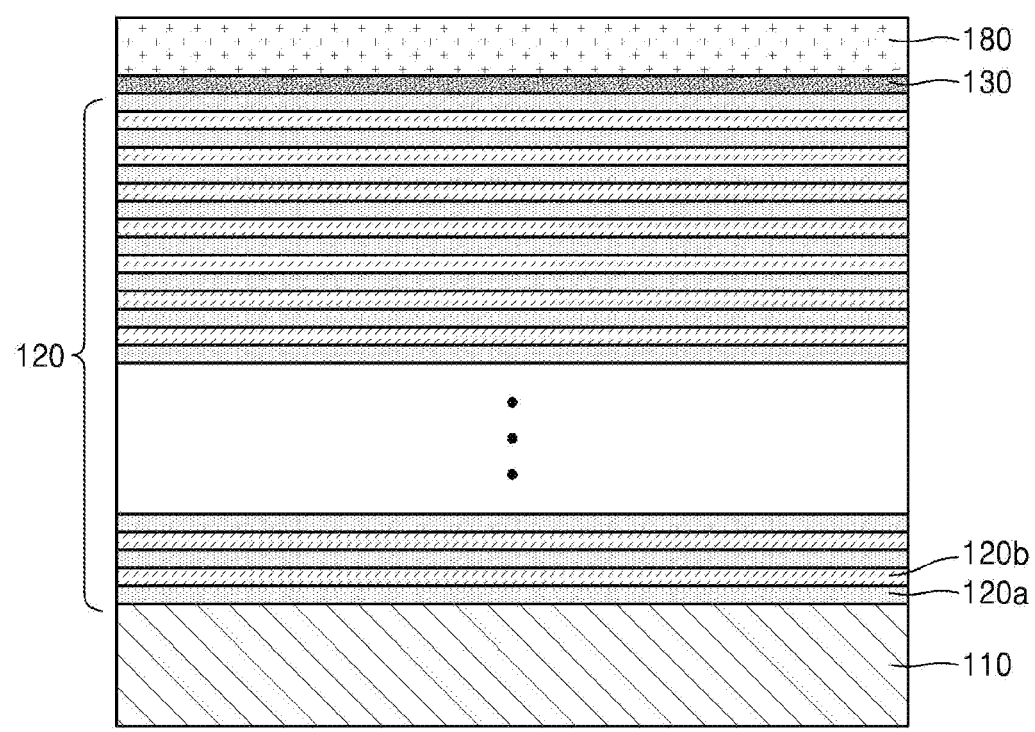
FIGS. 11A and 11B are cross-sectional views for describing a reflective mask according to first comparative example and a method of manufacturing the same.
Figure 11B:
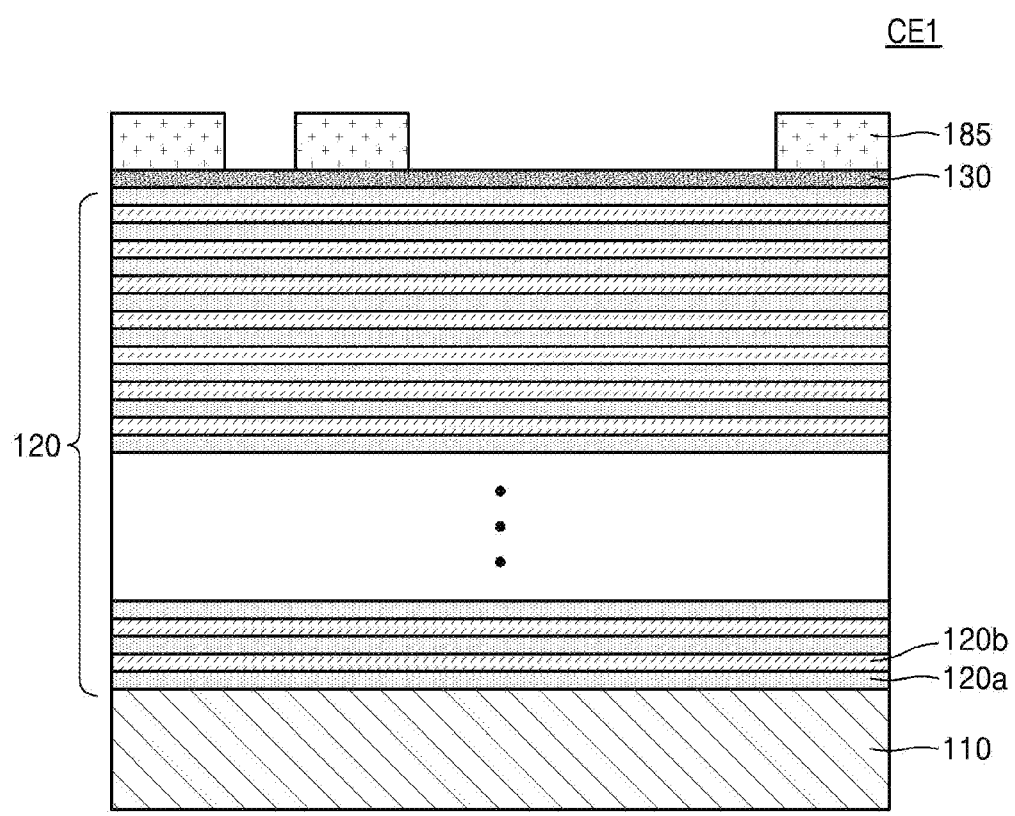

FIGS. 11A and 11B are cross-sectional views for describing a reflective mask according to first comparative example and a method of manufacturing the same.

Referring to FIG. 11A, a reflective multi-layer 120 and a capping layer 130 may be formed on a mask substrate 110. The reflective multi-layer 120 may be formed by alternately laminating a high-refractive-index layer 120a and a low-refractive-index layer 120b twice or more. For example, the low-refractive-index layer 120b may be an Mo layer, and the high-refractive-index layer 120a may be an Si layer. The capping layer 130 may be a silicon compound including at least one transition metal selected from the group consisting of ruthenium (Ru), nickel (Ni), and iridium (Ir).

A light absorption layer 180 may be formed on the capping layer 130. As described above, the light absorption layer 180 may include tantalum (Ta), which is a main component, and at least one element selected from the group consisting of hafnium (Hf), silicon (Si), zirconium (Zr), germanium (Ge), boron (B), nitrogen (N), and hydrogen (H).

Referring to FIG. 11B, then, the light absorption layer 180 may be patterned to form a light absorption pattern 185. In this way, a reflective mask CE1 according to first comparative example is completed. In the reflective mask CE1 according to first comparative example, because the light absorption pattern 185 protrudes on the capping layer 130, the shadowing effect may greatly occur as described above.

Figure 12A:
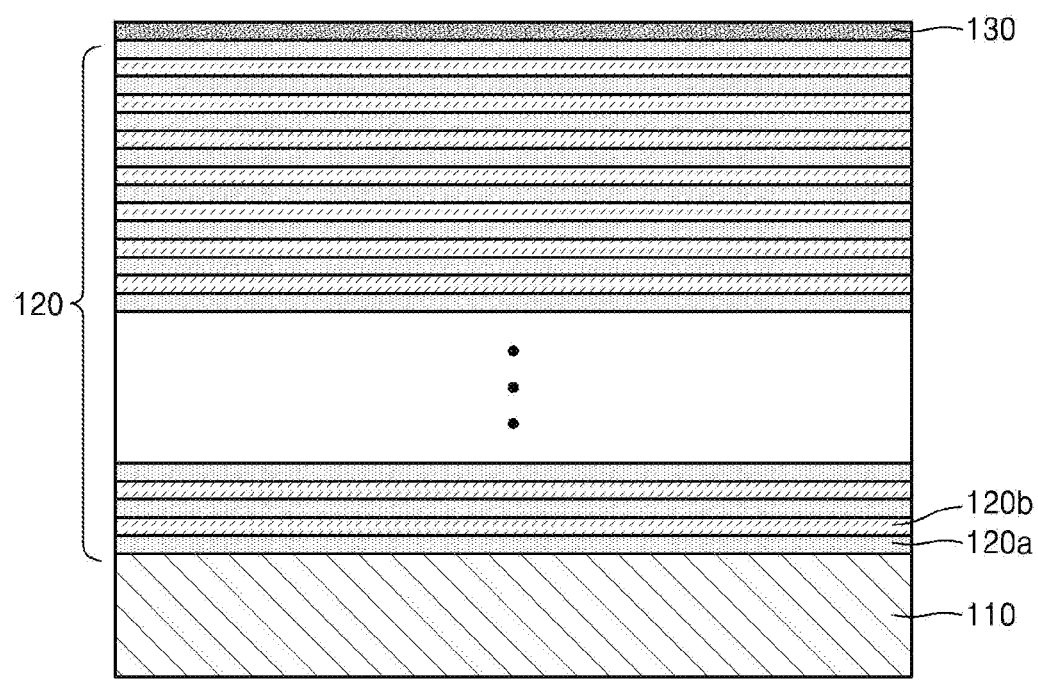
FIGS. 12A and 12B are cross-sectional views for describing a reflective mask according to second comparative example and a method of manufacturing the same.
Figure 12B:
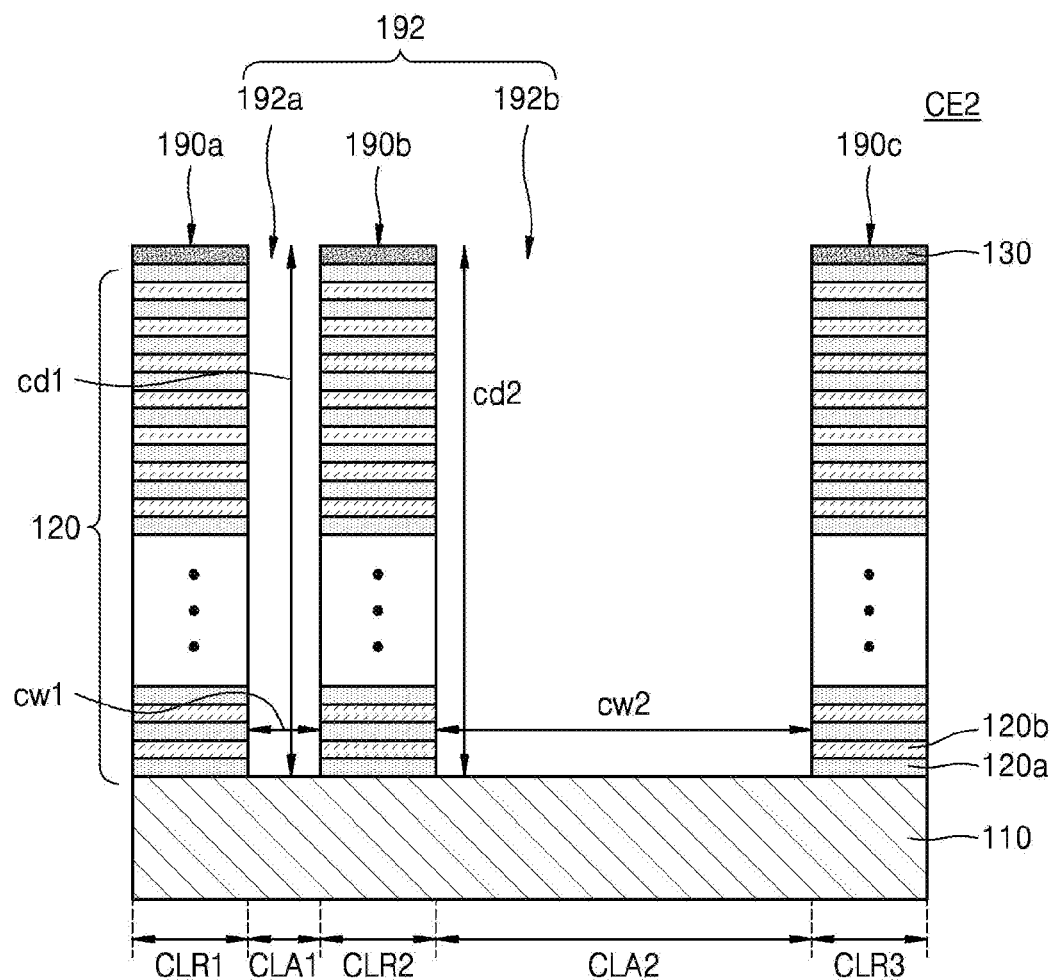

FIGS. 12A and 12B are cross-sectional views for describing a reflective mask according to second comparative example and a method of manufacturing the same.

Referring to FIG. 12A, a reflective multi-layer 120 and a capping layer 130 may be formed on a mask substrate 110. As described above with reference to FIG. 11A, the reflective multi-layer 120 may be formed by alternately laminating a high-refractive-index layer 120a and a low-refractive-index layer 120b twice or more. For example, the low-refractive-index layer 120b may be an Mo layer and the high-refractive-index layer 120a may be an Si layer. As described above with reference to FIG. 11A, the capping layer 130 may be a silicon compound including at least one transition metal selected from the group consisting of ruthenium (Ru), nickel (Ni), and iridium (Ir).

Referring to FIG. 12B, the reflective multi-layer 120 and the capping layer 130 may be etched to form a bottom trench 192 exposing the mask substrate 110. The bottom trench 192 may be formed by forming a mask pattern (not illustrated) on the capping layer 130 and dry-etching the reflective multi-layer 120 until the mask substrate 110 is exposed.

The bottom trench 192 may include a first bottom trench 192a and a second bottom trench 192b separate from the first bottom trench 192a. A width CW2 of the second bottom trench 192b may be greater than a width CW1 of the first bottom trench 192a. A depth cd2 of the second bottom trench 192b may be equal to a depth cd1 of the first bottom trench 192a.

Areas where the first bottom trench 192a and the second bottom trench 192b are formed may become a first light absorption area CLA1 and a second light absorption area CLA2 in comparative example, respectively. Areas except for the first and second light absorption areas CLA1 and CLA2 may become reflection areas CLR1, CLR2, and CLR3 in comparative example. The reflection areas CLR1, CLR2, and CLR3 may correspond to reflection patterns 190a, 190b, and 190c, respectively.

The reflective multi-layer 120 and the capping layer 130 may be etched to form the reflection patterns 190a, 190b, and 190c and the bottom trench 192 exposing the mask substrate 110. In this manner, a reflective mask CE2 according to second comparative example is completed.

Because the reflective mask CE2 according to second comparative example is formed by etching the reflective multi-layer 120 and the capping layer 130 up to the surface of the mask substrate 110, the reflection patterns 190a, 190b, and 190c may be attached to one another, or may collapse. In addition, because the reflective mask CE2 according to second comparative example is formed by etching the reflective multi-layer 120 and the capping layer 130 up to the surface of the mask substrate 110, upper and lower widths of the reflection patterns 190a, 190b, and 190c may be different from one another.

Figure 13:
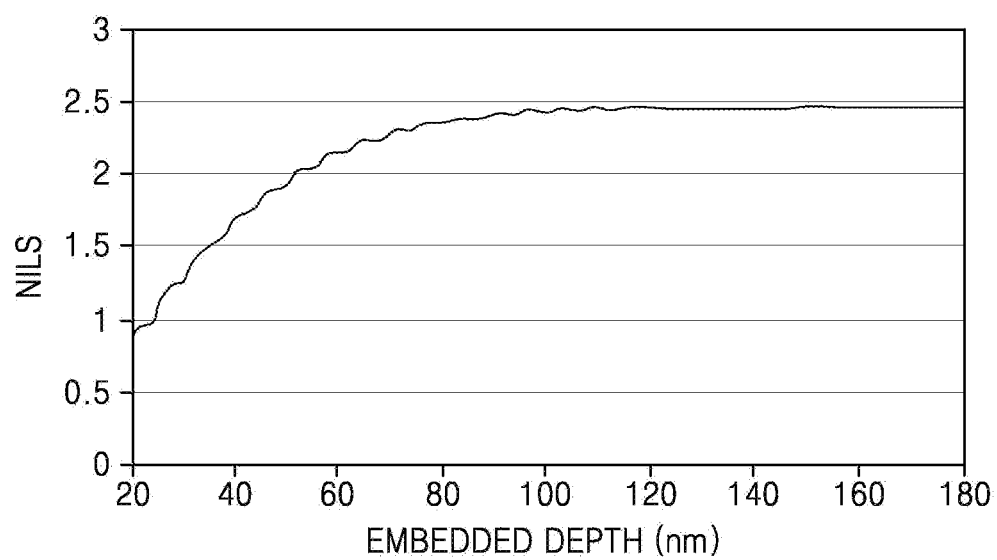
FIG. 13 is a graph of a normalized image log slope (NILS) value with respect to an embedded depth of a light absorption pattern in the reflective mask according to some example embodiments of the inventive concepts.

FIG. 13 is a graph of a normalized image log slope (NILS) value with respect to an embedded depth of the light absorption pattern in a reflective mask according to some example embodiments of the inventive concepts.

Referring to FIG. 13, the NILS value may be the criterion for evaluating a contrast between the mask patterns of a reflective mask. The NILS value may mean a slope of a log scale of an aerial image indicating the intensity of the mask pattern. That is, as the contrast increases, a distinction between a light reflection area and a light absorption area is clearer. Accordingly, a difference between a maximum point and a minimum point of the intensity of the aerial image increases and the NILS value increases. When the NILS value is 2.0 or more, the use as the reflective mask may be facilitated.

As illustrated in FIG. 13, it can be seen that the NILS value is not changed when the embedded depth of the light absorption pattern 150 is 100 nm or more. Based on the NILS value, the embedded depth of the light absorption pattern 150 of the reflective mask 100 according to some example embodiments of the inventive concepts may be set to about 80 nm to about 100 nm. In some example embodiments, the embedded depth may be set to about 80 nm to about 120 nm.

Figure 14:
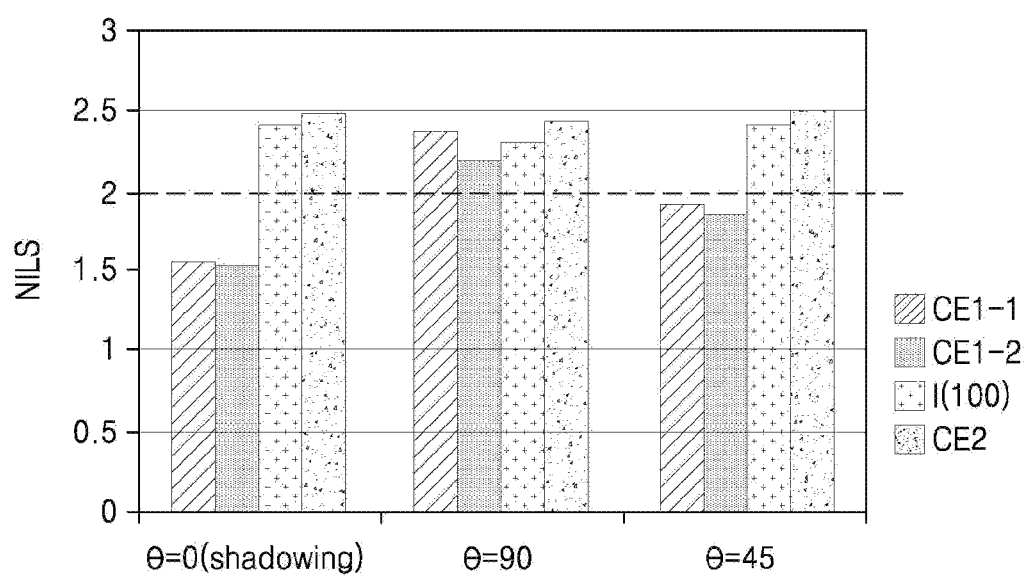
FIG. 14 is a graph of an NILS value with respect to a gradient of a light absorption pattern in the reflective masks according to some example embodiments and a comparative example.

FIG. 14 is a graph of an NILS value with respect to a gradient of the light absorption pattern in the reflective masks according to some example embodiments and a comparative example.

Specifically, in FIG. 14, the NA of the lens of the condenser optics of the EUV lithography apparatus is 0.5, the CRA is 8 degrees, the reduction ratio of the reduction optics is four times, and the NILS value is simulated with respect to the line and space pattern of 10 nm. In an X axis, θ=0 represents that the shadowing effect is strong because the gradient of the mask pattern is 0. In the X axis, θ=90 represents that the shadowing effect does not occur because the gradient of the mask pattern is 90. In the X axis, θ=45 represents that the shadowing effect is medium because the gradient of the mask pattern is 45.

In FIG. 14, CE1-1 and CE1-2 represent the first comparative example, and CE1-2 indicates that the thickness of the light absorption pattern is slightly small as compared with CE1-1. CE2 represents the second comparative example, and I(100) indicates the use of the reflective mask according to some example embodiments of the inventive concepts.

As indicated by I(100) of FIG. 14, the NILS value of the reflective mask according to some example embodiments of the inventive concepts is greater than 1.5 of comparative example and is 2.5 greater than 2.0 of the reference value. In addition, the NILS value of the reflective mask according to some example embodiments of the inventive concepts is similar to that of second comparative example even when the shadowing effect occurs.

Figure 15:
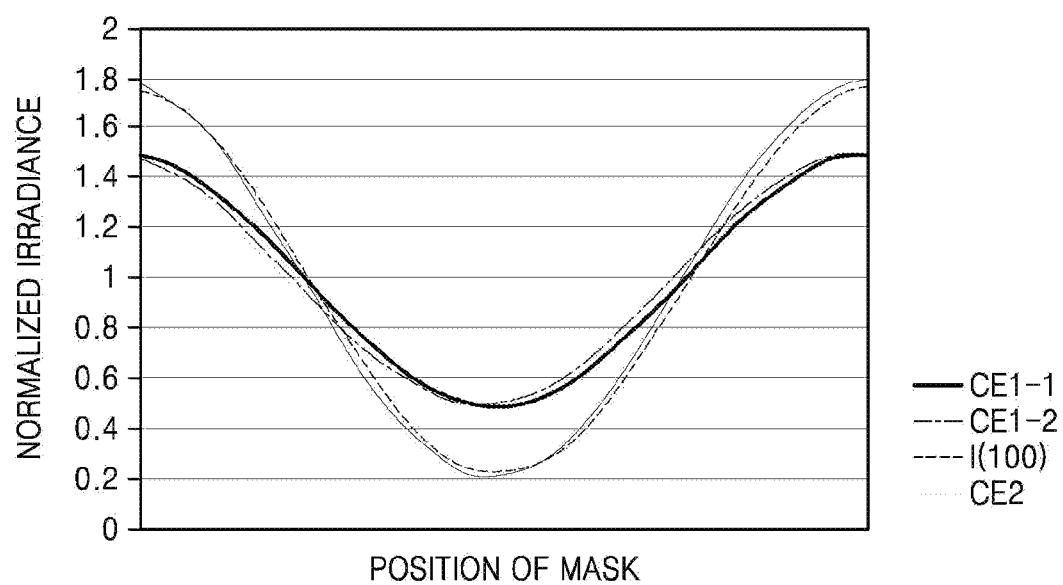
FIG. 15 is a graph of a normalized irradiance of the reflective mask according to some example embodiments of the inventive concepts.

FIG. 15 is a graph of a normalized irradiance of the reflective mask according to some example embodiments of the inventive concepts.

Specifically, in FIG. 15, CE1-1 and CE1-2 represent the first comparative example, and CE1-2 indicates that the thickness of the light absorption pattern is slightly small as compared with CE1-1. CE2 represents the second comparative example, and I(100) indicates the use of the reflective mask according to some example embodiments of the inventive concepts.

As indicated by I(100) of FIG. 15, in the reflective mask according to some example embodiments of the inventive concepts, a slope profile of a line indicating a normalized irradiance according to a position of a mask is sharp similarly to second comparative example. When the normalized irradiance is sharp, it means that the contrast between the light absorption area (light absorption pattern) and the reflection area of the reflective mask is high.

Figure 16A:
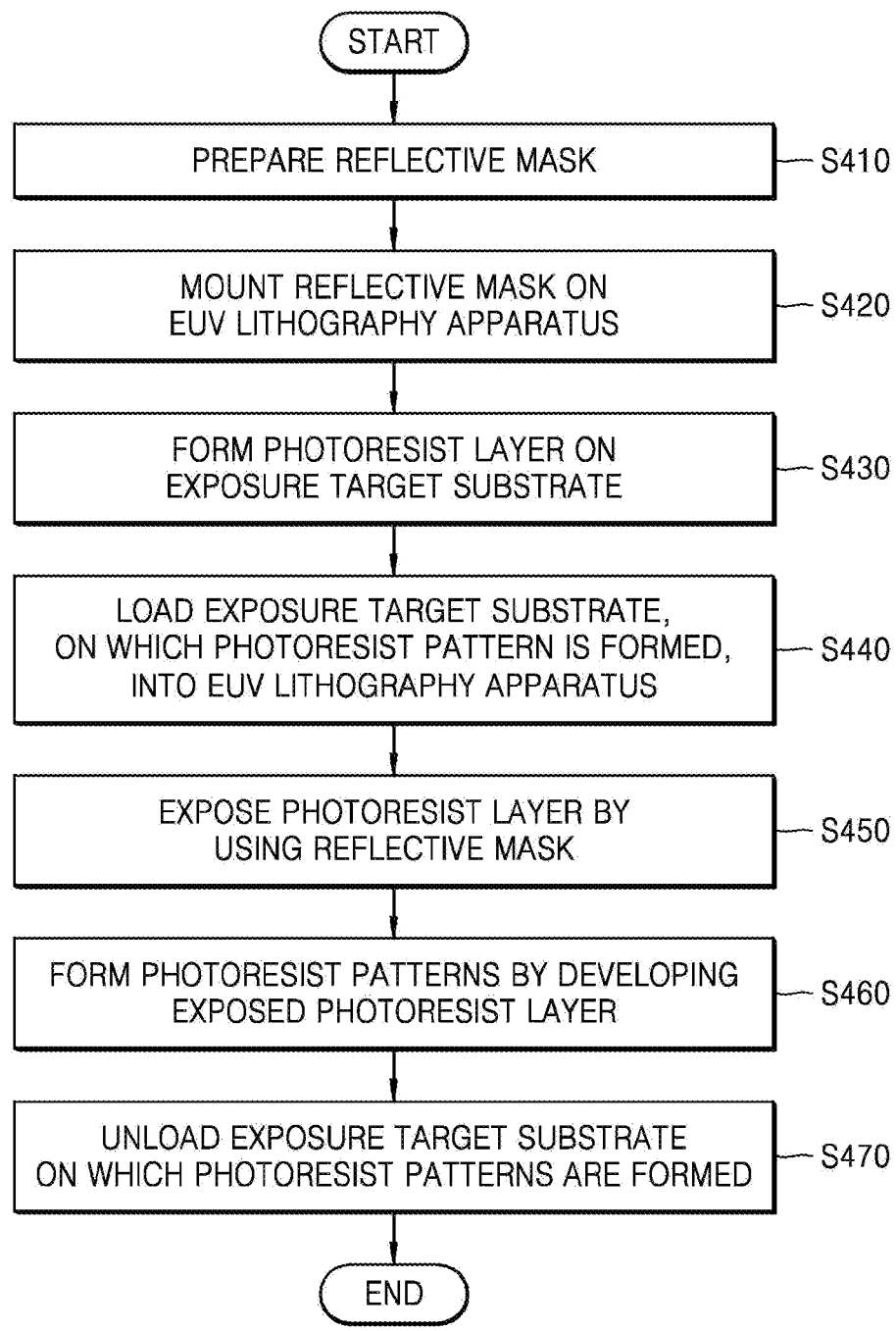
FIG. 16A is a flowchart of a method of forming a pattern by using a reflective mask, according to some example embodiments of the inventive concepts.
Figure 16B:
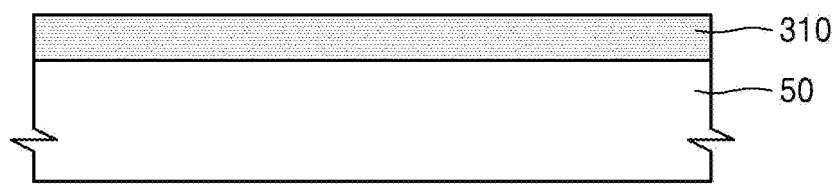
FIGS. 16B and 16C are cross-sectional views for describing a method of forming a pattern by using a reflective mask, according to some example embodiments of the inventive concepts.
Figure 16C:
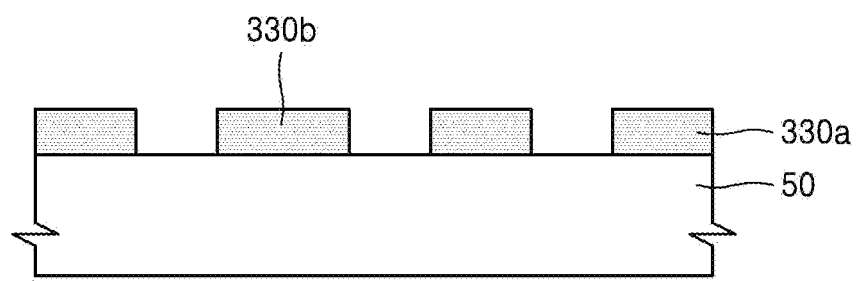

FIG. 16A is a flowchart of a method of forming a pattern by using a reflective mask, according to some example embodiments of the inventive concepts, and FIGS. 16B and 16C are cross-sectional views for describing the method of forming the pattern by using the reflective mask, according to some example embodiments of the inventive concepts.

Specifically, as described above, reflective masks 100 and 100-1 to 100-4 are prepared (S410). The reflective masks 100 and 100-1 to 100-4 are mounted on the EUV lithography apparatus 200 of FIG. 1 (S420).

As illustrated in FIG. 16B, a photoresist layer 310 is coated on an exposure target substrate 50, for example, a silicon wafer (S430). The photoresist layer 310 may be formed by coating a positive photoresist or a negative photoresist.

The exposure target substrate 50, on which the photoresist layer 310 is coated, is loaded on the substrate stage 52 of the EUV lithography apparatus 200 of FIG. 1 (S440). The photoresist layer 310, which is disposed on the exposure target substrate 50, is exposed by using the reflective mask 100 and 100-1 to 1004 mounted on the EUV lithography apparatus 200 of FIG. 1 (S450).

As illustrated in FIG. 16C, the exposed photoresist layer 310 is developed to form photoresist patterns 330a and 330b (S460). Critical dimensions (widths or intervals) of the photoresist patterns 330a and 330b may be equal to or different from one another. In FIG. 16C, for convenience, the critical dimension (width) of the photoresist pattern 330b is illustrated as being greater than the critical dimension (width) of the photoresist pattern 330a.

The exposure target substrate 50, on which the photoresist patterns 330a and 330b are formed, is unloaded from the EUV lithography apparatus 200 (S470). Through the above-described manufacturing processes, the photoresist patterns 330a and 330b are formed on the exposure target substrate 50.

Figure 17:
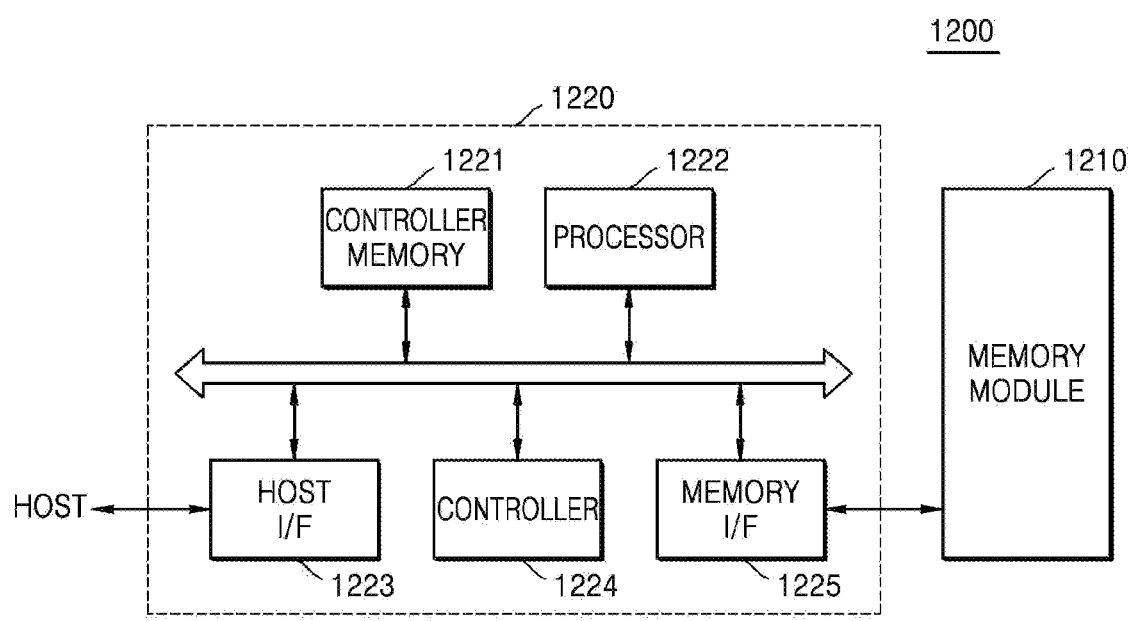
FIG. 17 is a block diagram of a memory card including an integrated circuit manufactured by using a reflective mask, according to some example embodiments of the inventive concepts.

FIG. 17 is a block diagram of a memory card including an integrated circuit manufactured by using a reflective mask, according to some example embodiments of the inventive concepts.

Referring to FIG. 17, a memory card 1200 may include a memory controller 1220 that generates a command/address signal, and a memory module 1210, for example, a flash memory including one or more flash memory elements. The memory controller 1220 may include a host interface 1223 that transmits the command/address signal to a host or receives the command/address signal from the host, and a memory interface 1225 that transmits the command/address signal to the memory module 1210 or receives the command/address signal from the memory module 1210. The host interface 1223, the controller 1224, and the memory interface 1225 may communicate with a controller memory 1221 such as a static random access memory (SRAM) and a processor 1222 such as a central processing unit (CPU) through a common bus.

The memory module 1210 may receive the command/address signal from the memory controller 1220. In response to the command/address signal, the memory module 1210 may store data in at least one memory element on the memory module 1210 and search data from the at least one memory element. Each of the memory elements may include a plurality of addressable memory cells, and a decoder that receives the command/address signal and generates a row signal and a column signal so as to access at least one among the addressable memory cells during program and read operations.

At least one among the components of the memory card 1200 including the memory controller 1220, the electronic devices 1221, 1222, 1223, 1224, and 1225 included in the memory controller 1220, and the memory module 1210 may include the integrated circuit manufactured using the reflective masks 100 and 100-1 to 100-4 according to some example embodiments s of the inventive concepts.

Figure 18:
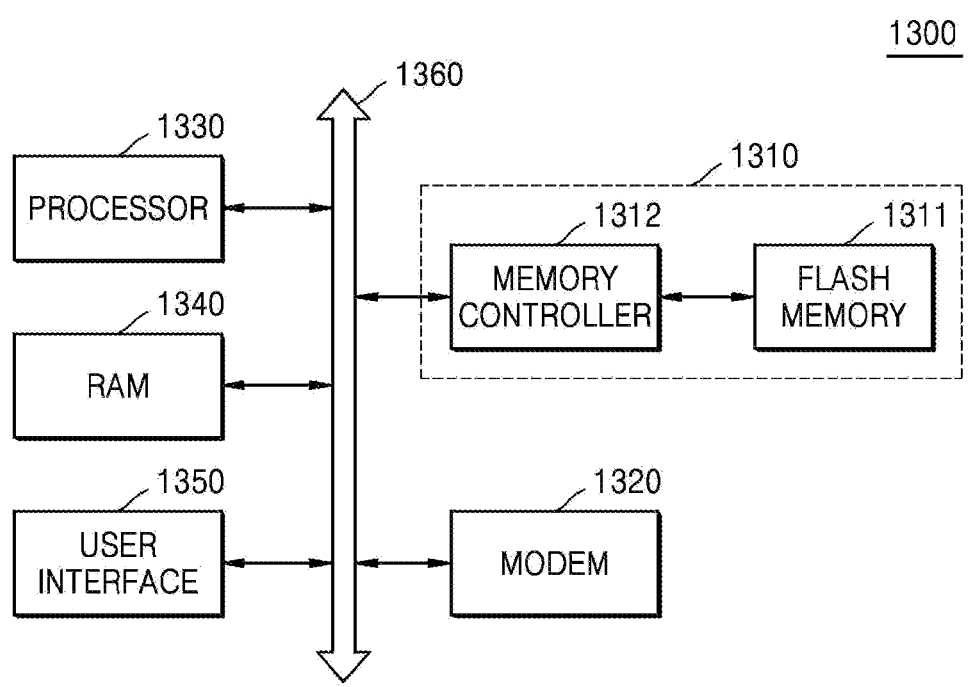
FIG. 18 is a block diagram of a memory system including an integrated circuit manufactured by using a reflective mask, according to some example embodiments of the inventive concepts.

FIG. 18 is a block diagram of a memory system including an integrated circuit manufactured by using a reflective mask, according to some example embodiments of the inventive concepts.

Referring to FIG. 18, a memory system 1300 may include a processor 1330 such as a CPU, a random access memory (RAM) 1340, a user interface 1350, and a modem 1320, all of which communicate with one another through a common bus 1360. The respective elements may transmit signals to the memory card 1310 through the common bus 1360 and receive signals from the memory card 1310. The memory system 1300, which includes the memory card 1310, the processor 1330, the RAM 1340, the user interface 1350, and the modem 1320 may include the integrated circuit manufactured through the reflective masks 100 and 100-1 to 100-4 according to some example embodiments of the inventive concepts.

The memory system 1300 may be applied to various fields of electronic applications. For example, the memory system 1300 may be applied to solid state drives (SSDs), complementary metal-oxide semiconductor (CMOS) image sensors (CISs), and computer application chipset fields. The memory systems and the elements described herein may be any type of package, including ball grid arrays (BGAs), chip scale packages (CSPs), plastic leaded chip carrier (PLCC), plastic dual in-line package (PDIP), multi chip package (MCP), wafer-level fabricated package (WFP), or wafer-level processed stack package (WSP), and are not limited thereto.

While the inventive concepts have been particularly shown and described with reference to example embodiments thereof, it will be understood that various changes in form and details may be made therein without departing from the spirit and scope of the following claims.

What is claimed is:

1. A reflective mask, comprising:
a reflective multi-layer on a mask substrate;
a plurality of support patterns spaced apart from one another,
the support patterns being in a main trench of the reflective multi-layer,
the support patterns corresponding to areas of the reflective mask not transferred onto an exposure target substrate, and
the support patterns partitioning the main trench to form a plurality of auxiliary trenches; and
a light absorption pattern including a plurality of auxiliary light absorption patterns, the auxiliary light absorption patterns being in the auxiliary trenches.

2. The reflective mask of claim 1, wherein the auxiliary light absorption patterns are recessed within the auxiliary trenches.

3. The reflective mask of claim 1, wherein the support patterns have a same width.

4. The reflective mask of claim 1, wherein the support patterns are integral with the reflective multi-layer.

5. The reflective mask of claim 1, wherein
the support patterns have a same depth, and
the auxiliary light absorption patterns have a same thickness.

6. The reflective mask of claim 1, wherein
the support patterns have different depths, and
the auxiliary light absorption patterns have different thicknesses.

7. The reflective mask of claim 1, further comprising:
a capping layer on the reflective multi-layer so as to protect the reflective multi-layer,
the main trench extending through the capping layer.

8. A reflective mask, comprising:
a reflective multi-layer on a mask substrate;
a first light absorption pattern in a first main trench of the reflective multi-layer; and
a second light absorption pattern spaced apart from the first light absorption pattern,
the second light absorption pattern being in a second main trench of the reflective multi-layer, and
the second main trench being wider than the first main trench.

9. The reflective mask of claim 8, wherein the first light absorption pattern and the second light absorption pattern are recessed within the first main trench and the second main trench, respectively.

10. The reflective mask of claim 8, wherein a depth of the second main trench is equal to a depth of the first main trench.

11. The reflective mask of claim 8, wherein a depth of the second main trench is deeper than a depth of the first main trench.

12. The reflective mask of claim 8, wherein the second light absorption pattern includes a plurality of auxiliary light absorption patterns.

13. The reflective mask of claim 12, further comprising:
support patterns between the auxiliary light absorption patterns in the second main trench,
the support patterns supporting the auxiliary light absorption patterns, and
the support patterns corresponding to areas of the reflective mask not transferred onto an exposure target substrate.

14. The reflective mask of claim 12, wherein the auxiliary light absorption patterns have different depths.

15. A reflective mask, comprising:
a reflective multi-layer on a mask substrate, the reflective multi-layer including,
a first light-absorption region and a second light-absorption region spaced apart from each other, and
a reflective support pattern in the second light-absorption region; and
a light absorption pattern within the reflective multi-layer and interposed between the reflective support pattern.

16. The reflective mask of claim 15, wherein the reflective support pattern protrudes from an upper surface of the reflective multi-layer.

17. The reflective mask of claim 15, wherein the reflective multi-layer is configured to reflect light having a wavelength of about 10 nm to about 124 nm.

18. The reflective mask of claim 15, wherein an uppermost surface of the reflective support pattern is coplanar with an uppermost surface of the reflective multi-layer.

* * * * *